US006795560B2

(12) United States Patent
Hamamatsu

(10) Patent No.: US 6,795,560 B2
(45) Date of Patent: Sep. 21, 2004

(54) DIGITAL MIXER AND DIGITAL MIXING METHOD

(75) Inventor: Hiroshi Hamamatsu, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 167 days.

(21) Appl. No.: 10/278,523

(22) Filed: Oct. 23, 2002

(65) Prior Publication Data

US 2003/0086580 A1 May 8, 2003

(30) Foreign Application Priority Data

Oct. 24, 2001 (JP) ....................................... 2001-325969

(51) Int. Cl.[7] ............................ H04B 1/00; H04R 5/00; H03G 3/00; G06F 17/00; G10H 7/00; H04H 9/00

(52) U.S. Cl. ........................... 381/119; 381/17; 381/61; 700/94; 84/625; 369/7

(58) Field of Search ............................ 381/119, 61, 17, 381/307; 700/94; 369/4; 84/615, 625

(56) References Cited

U.S. PATENT DOCUMENTS 5,487,067 A * 1/1996 Matsushige ................. 370/460
5,636,283 A 6/1997 Hill et al. ..................... 381/17
5,768,126 A * 6/1998 Frederick ..................... 700/94
6,005,948 A * 12/1999 Maeda ........................ 381/18
6,007,228 A * 12/1999 Agarwal et al. .............. 700/94
6,642,876 B2 * 11/2003 Subramoniam et al. ..... 341/144

OTHER PUBLICATIONS

O2R Digital Recording Console Version 2 User's Guide, Surround Plan, Yamaha Corporation Pro Audio & Digital Musical Instrument Division, Feb. 2000.

* cited by examiner

*Primary Examiner*—Minsun Oh Harvey
*Assistant Examiner*—Laura A. Grier
(74) *Attorney, Agent, or Firm*—Morrison & Foerster LLP

(57) ABSTRACT

To mix signals of a plurality of input channels, first buses and second buses are provided. It is possible that, even when a user has selected a desired first surround mode and a desired effect to be imparted, an effecter is capable of performing only an effect process corresponding to a second surround mode. However, if arrangements are made such that the input signals are subjected to level adjustment corresponding to the second surround mode and mixed via the second buses to the effecter, the effecter can impart the mixed signals with an effect corresponding to the second surround mode. The effect-imparted signals are returned to the first buses, and mixed on the first buses to provide effect-imparted signals corresponding to the first surround mode. In the second surround mode, sound image localization may be controlled to follow localization in the first surround mode.

29 Claims, 9 Drawing Sheets

ALLOCATION, TO SURROUND CHANNEL, OF MIX BUS

| SURROUND MODE | BUS1 | BUS2 | BUS3 | BUS4 | BUS5 | BUS6 | BUS7 | BUS8 |
|---|---|---|---|---|---|---|---|---|
| STEREO | | | | | | | | |
| 2+2 | L | R | Ls | Rs | | | | |
| 3+1 | L | R | C | S | | | | |
| 5. 1 | L | R | Ls | Rs | C | LFE | | |
| 6. 1 | L | R | Ls | Rs | C | LFE | Cs | |
| 7. 1 | L | R | Ls | Rs | C | LFE | Lc | Rc |

FIG. 13

ON/OFF SETTING OF FOLLOW SURROUND IN AUX BUS

| AUX SURROUND MODE | AUX1 | AUX2 | AUX3 | AUX4 | AUX5 | AUX6 | AUX7 | AUX8 |
|---|---|---|---|---|---|---|---|---|
| STEREO | NON-SETTABLE | | NON-SETTABLE | | NON-SETTABLE | | NON-SETTABLE | |
| 2+2 | SETTABLE | | SETTABLE | | NON-SETTABLE | | NON-SETTABLE | |
| 3+1 | SETTABLE | | SETTABLE | | NON-SETTABLE | | NON-SETTABLE | |
| 5. 1 | SETTABLE | | SETTABLE | | SETTABLE | | NON-SETTABLE | |
| 6. 1 | SETTABLE | | SETTABLE | | SETTABLE | | SETTABLE | |
| 7. 1 | SETTABLE | | SETTABLE | | SETTABLE | | SETTABLE | |

FIG. 14

ALLOCATION, TO SURROUND CHANNEL, OF AUX BUS

| AUX SURROUND MODE | AUX1 | AUX2 | AUX3 | AUX4 | AUX5 | AUX6 | AUX7 | AUX8 |
|---|---|---|---|---|---|---|---|---|
| STEREO | | | | | | | | |
| 2+2 | L | R | Ls | Rs | | | | |
| 3+1 | L | R | C | S | | | | |
| 5. 1 | L | R | Ls | Rs | C | LFE | | |
| 6. 1 | L | R | Ls | Rs | C | LFE | Cs | |
| 7. 1 | L | R | Ls | Rs | C | LFE | Lc | Rc |

FIG. 15

DIGITAL MIXER AND DIGITAL MIXING METHOD

BACKGROUND OF THE INVENTION

The present invention relates to a digital mixer and a digital mixing method which are capable of providing effect-imparted mixed signals in a predetermined surround mode.

Audio mixing consoles have been known which are operable to adjust levels and frequency characteristics of audio signals input from many microphones or electric or electronic musical instruments, mix the thus-adjusted audio signals into several mixed audio signal groups, and delivers the mixed audio signals groups to power amplifiers. Generally, a human operator of the mixing console adjusts respective tone volumes and colors of audio signals representative of musical instrument tones and/or singing voices to conditions that appear to most appropriately express a performance, by manipulating various panel operators provided on the mixing console. The mixing console includes, as a signal input section of the console, a plurality of input channels for inputting signals from a plurality of microphones and external equipment (microphone/line input signals), and the signal input section is programmed to perform mixing on the input signals in a desired manner and pass resultant mixing-processed signals to a plurality of output channels constituting a signal output section of the console. Generally, the signals of the individual input channels are amplified by head amplifiers and then delivered to a mixing processing section that adjusts respective frequency characteristics and levels of the signals and then performs mixing on the signals in programmed combinations. After that, each of the thus mix-processed signals is set to a desired output level via an output fader and then passed to one of the output channels.

Typically, such mixing consoles are employed in theaters and concert halls and also used in recording studios to produce music sources for recording onto compact disks (CDs), DVDs, etc. For example, in the case of the mixing console employed in a concert hall, tones performed by musical instruments and singing voices are input via a plurality of microphones installed on and/or near a stage. The mixing console adjusts the levels and frequency characteristics of audio signals input via the microphones and mixes the thus-adjusted signals in desired combinations. Then, the mixing console adjusts the levels of the mixed signals and outputs the thus level-adjusted mixed signals to power amplifiers for driving speakers. There have been known digital mixers that use DSPs and the like to digitally perform the mixing processing in such mixing consoles.

Generally, for reproduction of sounds of movies, DVD software and the like, or for sound production in theaters and the like, a plurality of speakers are placed at front and rear positions (i.e., in front of and in back of audience seats) in order to produce a sound field affording a high sense of presence or realism to the audience. Systems for producing such a high sense of presence or realism are commonly called "surround systems". Most of the known digital mixers too are constructed to produce mixed signals that can attain a surround effect using any desired one of various surround modes, several of which are illustratively shown in FIGS. 16A to 16F.

The surround mode shown in FIG. 16A is a "stereo" mode, where left and right front speakers L, R are placed to achieve a sense of realism. The surround mode shown in FIG. 16B is a "(2+2)-channel" mode, where left and right front speakers L, R and left and right rear speakers Ls, Rs are placed to achieve a sense of realism. Further, the surround mode shown in FIG. 16C is a "(3+1)-channel" mode, where left, center and right front speakers L, C, R, and one center rear speaker S are placed to achieve a sense of realism.

Furthermore, FIG. 16D shows a "5.1-channel" mode, where left, center and right front speakers L, C, R, and left and right rear speakers Ls, Rs are placed, with a woofer speaker LFE placed at a suitable position, to achieve a sense of realism. FIG. 16E shows a "6.1-channel" mode, where left, center and right front speakers L, C, R, and left, center and rear speakers Ls, Cs, Rs are placed, with a woofer speaker LFE placed at a suitable position, to achieve a sense of realism. Furthermore, FIG. 16F shows a "7.1-channel" mode, where left, center and right front speakers L, C, R, left-center and right-center front speakers Lc, Rc, and left and right rear speakers Ls, Rs are placed, with a woofer speaker LFE placed at a suitable position, to achieve a sense of realism.

In the conventional digital mixers, sound image localization control corresponding to a designated surround mode can be performed, via a mixing bus unit, on only one set of surround channels. Thus, when the sound image localization is to be reflected, for example, in an output signal to be imparted with an effect, setting for the sound image localization has to be performed on another set of surround channels without aid of the surround mode. For example, with the sound image localization control corresponding to the designated surround mode, the levels of the left, center and right front speakers L, C, R, and left and right rear speakers Ls, Rs of the 5.1 channels can be controlled by means of a single operator. However, in a case where no surround mode can be used, the levels of the left, center and right front speakers L, C, R and left and right rear speakers Ls, Rs of the 5.1 channels must be set independently one by one.

Sometimes, a user of the digital mixer may want to impart a desired effect, such as chorus or flange, when any one of the surround modes is selected. However, a plurality of effects selectable via an effecter do not necessarily include an effect of input channel construction that corresponds to the surround mode selected by the digital mixer. Also, the user does not always have to select an effect of input channel construction corresponding to the selected surround mode. Therefore, there has been a strong demand for measures to appropriately deal with the case where a particular surround mode selected by the digital mixer and the input channel construction of an effect selected by the effecter do not correspond to each other.

SUMMARY OF THE INVENTION

In view of the foregoing, it is an object of the present invention to provide a novel digital mixer and mixings method which can not only perform a set of surround mixing operations for main output, but also perform another set of mixing operations for effect impartment or the like in interlocking relation to (in such a manner as to follow) the surround mixing operations for main output.

It is another object of the present invention to provide a novel digital mixer aand mixing method which allows selection of mixing modes differing between surround mixing processing for main output and surround mixing processing for effect impartment or the like.

According to a first aspect of the present invention, there is provided a digital mixer which selectively delivers signals from one or more channels to at least one of first buses and second buses so that mixing of the signals is performed via each of said first buses and second buses, and selectively outputs the signals mixed via each of said first buses and second buses, wherein, when said digital mixer generates multi-channel surround signals, said channels adjust levels of first signals to be delivered from said channels to said first buses in accordance with a selected first surround mode and a localizing position of each of said channels, said channels adjust levels of second signals to be delivered from said channels to said second buses in accordance with a selected second surround mode and said localizing position of each of said channels, said second buses mix the second signals delivered thereto and output the mixed second signals to an effecter for imparting a given effect to the mixed second signals in accordance with to said second surround mode, and said first buses receive the second signals imparted with the given effect from the effecter, mix the received second signals with the first signals delivered thereto and output the mixed signals as multi-channel surround signals_ corresponding to said first surround mode.

In the present invention, the selected second surround mode may be a surround mode that can be handled by the effecter. The selected first surround mode may be the same as or different from the selected second surround mode.

According to the first aspect, the digital mixer performs, via the second buses, surround control, corresponding to the selected second surround mode, on an input signal so that the effecter can impart a given effect to the thus-controlled signal. Then, surround control corresponding to the selected first surround mode is performed, via the first bus, on the signal imparted with the given effect in the selected second surround mode. As a consequence, multi-channel surround signals imparted with the given effect are output via the first buses through the desired output channels. Therefore, even where the selected first surround mode, for example, is not possessed by (can not be handled by) the effecter associated with the digital mixer, the effecter can impart the effect after the signal is subjected, via the second buses, to the process corresponding to the selected second surround mode that can be handled by the effecter, and then the thus effect-imparted signal is subjected, via the first buses, to the process corresponding to the selected first surround mode. In this way, the present invention can provide multi-channel surround signals imparted with the given effect and corresponding to the selected first surround mode.

According to a second aspect of the present invention, there is provided a digital mixer which comprises: a plurality of input channels for controlling signals input to said digital mixer; a first bus section having a plurality of buses for performing mixing on signals given via one or more of said input channels; a second bus section having a plurality of buses for performing mixing on signals given via one or more of said input channels; a first designation device that designates a surround mode; a second designation device that, every said input channel, designates a localizing position in two-dimensional coordinates; a third designation device that, every said input channel, designates respective send levels of the signals with which the signals are to be delivered from the input channels to corresponding ones of the buses of said second bus section; and a fourth designation device that designates an ON/OFF state of a localization-following mode in said second bus section, wherein said plurality of input channels deliver respective input signals to corresponding ones of the buses of said first bus section after performing level control on the input signals in accordance with said surround mode designated by said first designation device and respective localizing positions of said input channels designated by said second designation device, wherein said plurality of input channels deliver respective input signals to the corresponding buses of said second bus section after performing level control on the input signals in accordance with the send levels designated by said third designation device, and wherein when the ON state of the localization-following mode is designated by said fourth designation device, said third designation device designates the send level of each of said input channels in accordance with the surround mode designated by said first designation device and the localizing position of the input channel designated by said second designation device, but when the OFF state of the localization-following mode is designated by said fourth designation device, said third designation device designates the send level of each of said input channels, irrespective of the surround mode designated by said first designation device and the localizing position of the input channel designated by said second designation device.

According to a third aspect of the present invention, there is provided a digital mixer which comprises: a plurality of input channels for controlling signals input to said digital mixer; a first bus section having a plurality of buses for performing mixing on signals given via one or more of said input channels; a second bus section having a plurality of buses for performing mixing on signals given via one or more of said input channels; a first designation device that designates a first surround mode of said first bus section; a second designation device that, every said input channel, designates a localizing position in two-dimensional coordinates; a third designation device that, every said input channel, designates respective send levels of the signals with which the signals are to be delivered from the input channels to corresponding ones of the buses of said second bus section; and a fourth designation device that designates a second surround mode of said second bus section, wherein said plurality of input channels deliver respective input signals to corresponding ones of the buses of said first bus section after performing level control on the input signals in accordance with said first surround mode designated by said first designation device and respective localizing positions of said input channels designated by said second designation device, wherein said plurality of input channels deliver respective input signals to the corresponding buses of said second bus section after performing level control on the input signals in accordance with the send levels designated by said third designation device, and wherein said third designation device designates the send level of each of said input channels in accordance with said second surround mode designated by said fourth designation device and the localizing position of the input channel designated by said second designation device.

According to the second aspect, the digital mixer performs, on the signal of each of the input channels, level control corresponding to the designated localizing position, and, when the localization-following mode is ON, the digital mixer controls the send level of the signal of the input channel in accordance with the designated surround mode and localizing position of the channel, to thereby output the thus-controlled signal to the second bus section. In this manner, another set of mixing operations that can be used for effect input or the like can be carried out in response to surround mixing operations for main output. According to the third aspect, the surround mode of the first bus section and the surround mode of the second bus section can be designated independently of each other. Thus, by the second bus section set in the second surround mode outputting the controlled signal and the effecter outputting the effect-imparted signal to the first bus section set in the first surround mode, the first bus section can provide the effect-imparted signal of the first surround mode even where the effecter is not equipped with the first surround mode.

The present invention may be constructed and implemented not only as the apparatus invention as discussed above but also as a method invention. Also, the present invention may be arranged and implemented as a software program for execution by a processor such as a computer or DSP, as well as a storage medium storing such a program. Further, the processor used in the present invention may comprise a dedicated processor with dedicated logic built in hardware, not to mention a computer or DSP capable of running a desired software program.

While the embodiments to be described herein represent the preferred form of the present invention, it is to be understood that various modifications will occur to those skilled in the art without departing from the spirit of the invention. The scope of the present invention is therefore to be determined solely by the appended claims.

BRIEF DESCRIPTION OF THE DRAWINGS

For better understanding of the object and other features of the present invention, its preferred embodiments will be described hereinbelow in greater detail with reference to the accompanying drawings, in which:

FIG. 13 is a diagram showing allocation, to surround channels, of MIX buses in the digital mixer of the present invention;

FIG. 14 is a diagram showing ON/OFF settings of the follow surround mode in the digital mixer of the present invention;

FIG. 15 is a diagram showing allocation, to surround channels, of AUX buses in the digital mixer of the present invention.

DETAILED DESCRIPTION OF THE EMBODIMENTS

Figure 1:
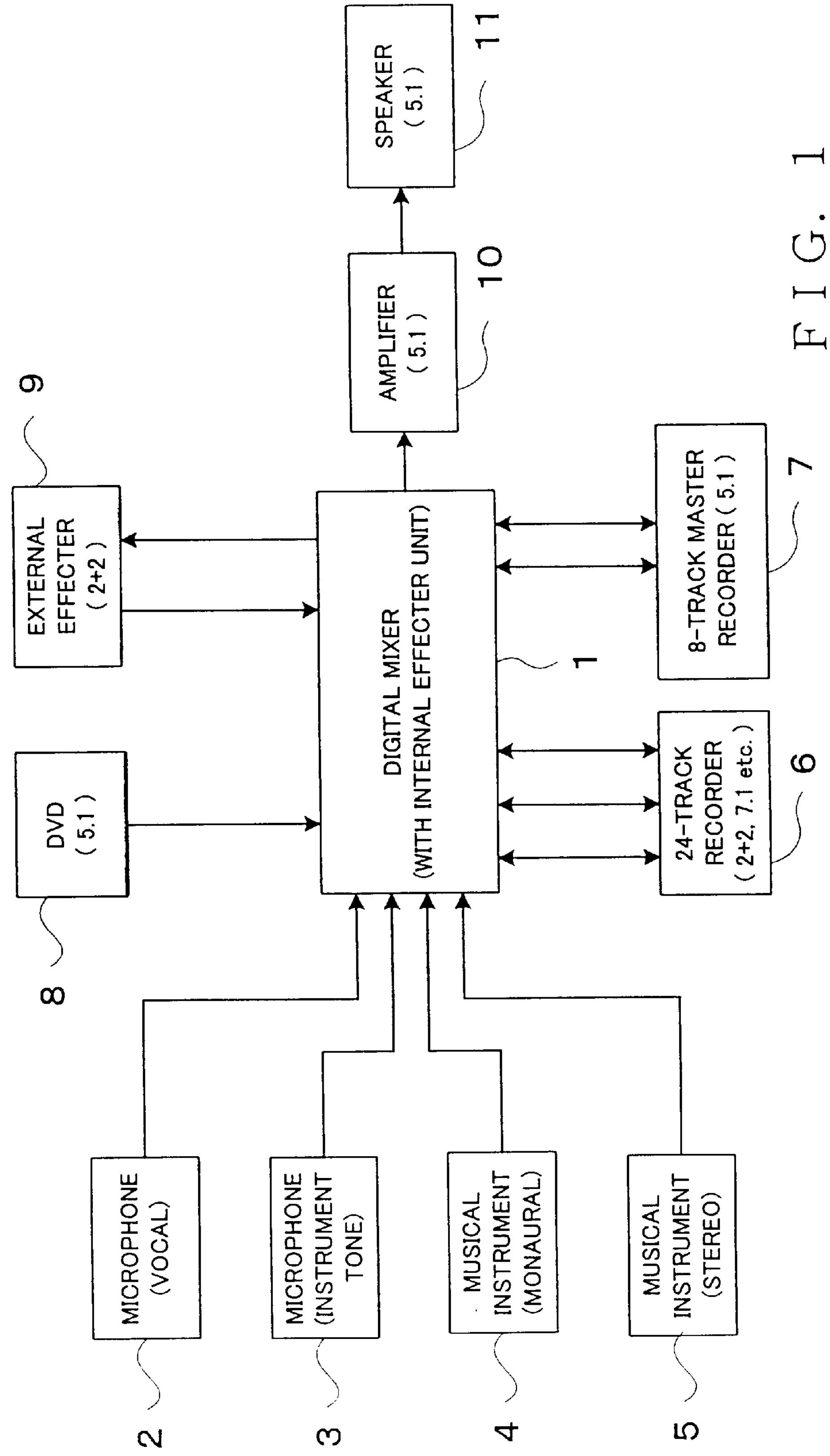
FIG. 1 is a block diagram showing a digital mixer in accordance with an embodiment of the present invention, and various peripherals connected to the digital mixer.

FIG. 1 is a block diagram showing a digital mixer in accordance with an embodiment of the present invention, and various peripherals connected to the digital mixer.

To the digital mixer 1 are connected a microphone 2 for picking up vocals (i.e., vocal microphone) and a microphone 3 for picking up tones played by a musical instrument (i.e., instrument tone microphone); the vocals (singing voices) and tones picked up by the vocal microphone 2 and instrument tone microphone 3 are input to the digital mixer 1. Two or more vocal microphones 2 and two or more instrument tone microphones 3 may be connected to the digital mixer 1. Also connected to the digital mixer 1 are a monaural musical instrument (i.e., musical instrument for producing monaural output) 4 and two-channel stereo musical instrument (i.e., musical instrument for producing stereo output) 5; tone signals generated by the musical instruments 4 and 5 are also input to the digital mixer 1. Two or more monaural musical instruments 4 and two or more stereo musical instruments 5 may be connected to the digital mixer 1. Among other signals input to the digital mixer 1 are digital signals of vocal sounds and tones output from a DVD (Digital Versatile Disk) drive 8 and signals of vocal sounds, tones, effect sounds and the like output from a 24-track recorder 6. The digital mixer 1 converts analog signals, included in the thus-input signals of vocal sounds, tones and the like, into digital representation, and then it adjusts frequency characteristics, delay time and the like of the converted digital signals to thereby send the thus-adjusted signals to a bus unit such as a mixing bus unit. At the same time, the digital mixer 1 sends digital signals, included in the input signals, to the bus unit after adjusting frequency characteristics, delay time and the like of the digital signals. The signals mixed via the bus unit are further adjusted in their frequency characteristics, delay time and output level and then ultimately output to outside the digital mixer 1.

The mixed signals output from the digital mixer 1 are amplified and audibly reproduced or sounded via a speaker 11. Also, the mixed signals output from the digital mixer 1 may be supplied to an 8-track master recorder 7 so that the recorder 7 can record the mixed signals.

Figure 16A:
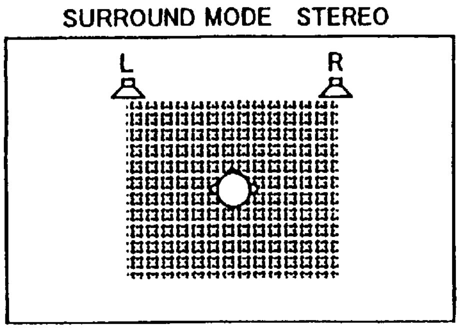
FIGS. 16A to 16F are diagrams showing examples of arrangement of speakers in various surround modes.
Figure 16B:
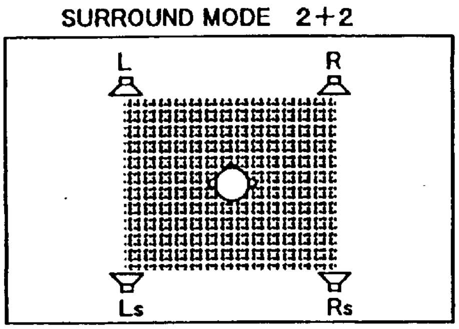
Figure 16C:
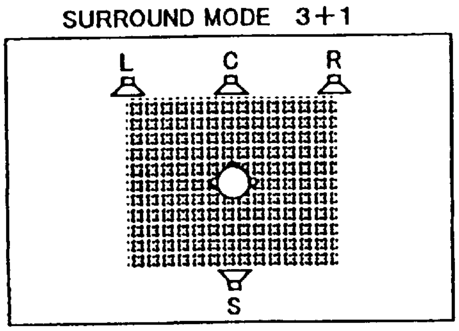
Figure 16D:
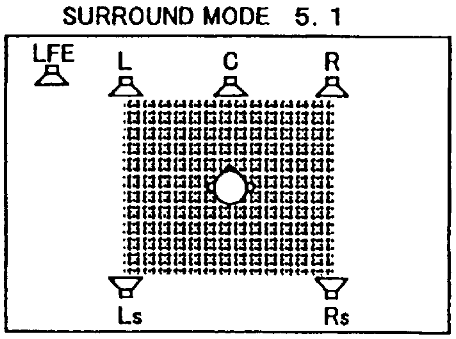
Figure 16E:
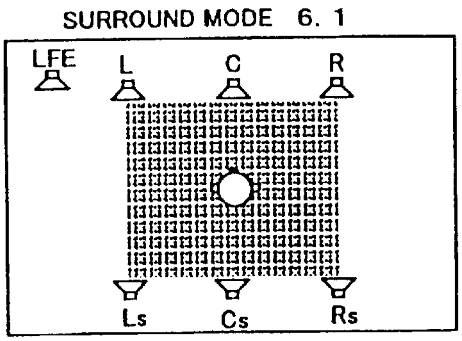
Figure 16F:
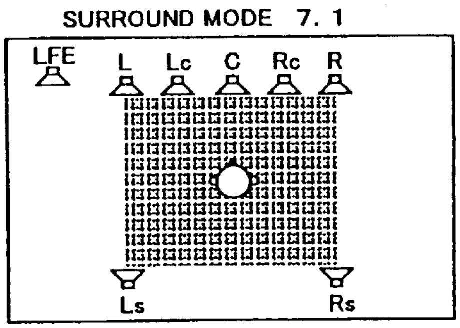
FIG. 16F (PRIOR ART)

FIG. 1 shows an example where a 5.1-channel mode is selected as a surround mode. In this case, surround signals corresponding to the selected 5.1-channel mode are output through six channels, and the surround signals of the six channels are amplified via respective amplifiers 10 and then sounded via six speakers 11 positioned in the manner as illustrated in FIG. 16D. In this way, there can be produced a sound field affording a full sense of presence or realism.

When a particular effect is to be imparted to the 5.1-channel surround signals in the digital mixer, the effect is imparted by an internal effecter contained in the digital mixer 1 or an external effecter 9 connected to the digital mixer 1. However, effects selectable by the external effecter 9 do not necessarily include effects corresponding to input construction of 5 or 5.1 channels. Even if the effects selectable by the external effecter 9 include effects corresponding to or compatible with input construction of 5 or 5.1 channels, the user do not necessarily selects one of these effects corresponding to the input construction of 5 or 5.1 channels. Here, let's now suppose a case where an effect of a (2+2)-channel mode is selected by the external effecter 9. Even when an effect of the (2+2)-channel mode is selected by the external effecter 9 like this, the digital mixer 1 of the present invention functions to perform mixing, via an AUX bus unit, on signals to be imparted with the selected effect in accordance with the (2+2)-channel mode and supply the external effecter 9 with the resultant mixing-processed signals corresponding to the (2+2)-channel mode so that the external effecter 9 can impart the selected effect to the signals and return the thus effect-imparted signals to the digital mixer 1. Then, the digital mixer 1 performs mixing on the returned effect-imparted signals via a MIX bus unit in accordance with the 5.1-channel mode, as a result of which it can ultimately add (mix) the effect-imparted signals from the external effecter 9 with surround signals of the 5.1-channel mode.

Figure 2:
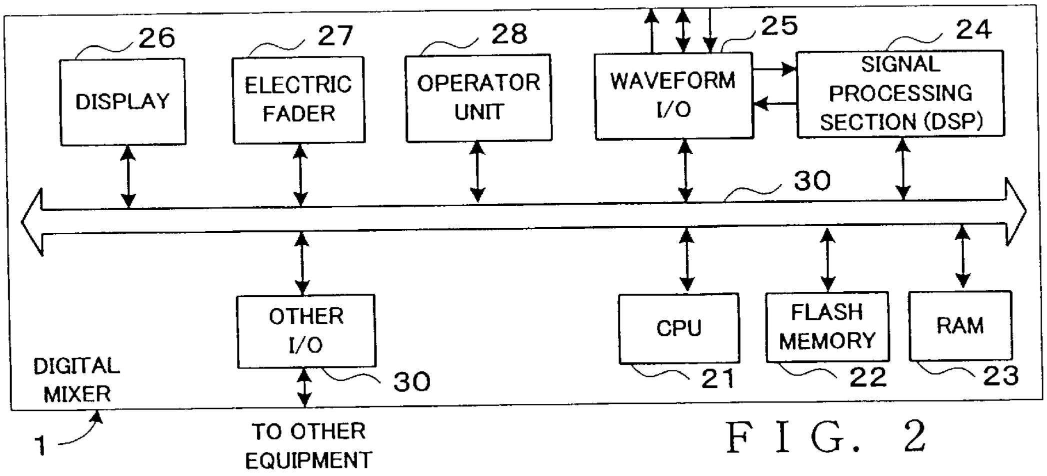
FIG. 2 is a block diagram showing a general setup of the digital mixer of the present invention.

FIG. 2 is a block diagram showing a general setup of the digital mixer 1 of the present invention.

The digital mixer 1 includes: a CPU (Central Processing Unit) 21 for controlling general behavior of the digital mixer 1 and generating control signals in response to operation of mixing and surround operators; a rewritable, nonvolatile flash memory 22 having stored therein various processing software, such as mixing control programs and surround control programs for execution by the CPU 21; and a RAM (Random Access Memory) 23 functioning as a working area for the CPU 21 and memory area for storing various data. With the flash memory 22 having stored therein the processing software, it is possible to upgrade the version of the processing software by rewriting the stored processing software. Signal processing section 24, which is composed of a multiplicity of DSPs, performs mixing processing and surround processing under the control of the CPU 21.

The digital mixer 1 further includes a waveform data interface (waveform I/O) 25 via which all waveform input and output to and from the digital mixer 1 are effected. For the waveform input, the waveform data interface 25 includes an analog input unit of a plurality of channels, a stereo analog input unit of a plurality of channels, and a stereo digital input unit of a plurality of channels. For the waveform output, the waveform data interface 25 includes an analog output unit of a plurality of channels, a stereo analog output unit of a plurality of channels, and a stereo digital output unit of a plurality of channels.

Further, in the digital mixer 1, a display device 26, which is, for example, in the form of a liquid crystal display (LCD), is capable of displaying, in a bar graph, levels of digital signals at various mixing stages. The display device 26 is also capable of displaying a two-dimensional localization control screen, surround-mode setting screen and follow-surround-mode setting screen, as will be later described in detail. Electric fader unit 27 is operable to adjust, either manually or electrically, output levels of signals to be delivered to the mixing (MIX) bus unit or auxiliary (AUX) bus unit and output levels of signals having been output from these bus units. Panel operator unit 28 includes a multiplicity of operators for controlling equalizing characteristics and panning characteristics of various signals. In making surround settings, a two-dimensional localizing position can be controlled as desired using a rotary encoder or joystick provided on the operator unit 28. Other interface (I/O) 29 is an interface via which signals are communicated between the digital mixer 1 and the DVD drive 8 and external effecter 9. Bus 30 is a common data path via which data are transferred between various components of the digital mixer 1.

Figure 3:
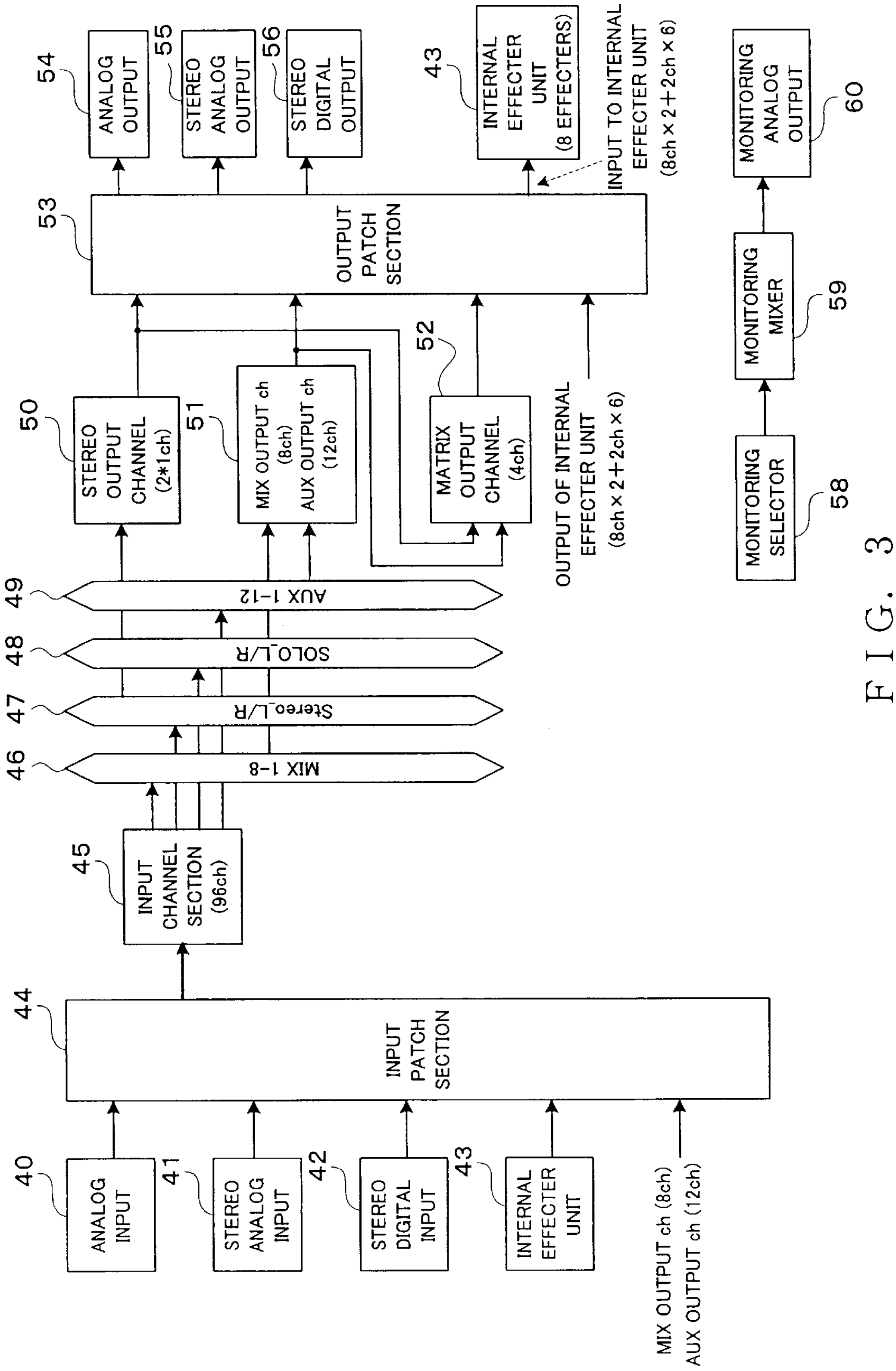
FIG. 3 is an equivalent functional block diagram showing various functions of the digital mixer of FIG. 2 for performing mixing processing and surround processing.

In FIG. 3, there is shown an equivalent functional block diagram showing various functions of the digital mixer 1 of FIG. 2 for performing the mixing processing and surround processing.

In FIG. 3, an analog audio signal input to the analog input unit (including an input card) 40 is converted via an internal A/D converter of the unit 40 into a digital audio signal and then passed to an input patch section 44. Stereo analog audio signals input to the stereo analog input unit (including an input card) 41 are converted via an internal A/D converter of the unit 41 into digital audio signals and then passed to the input patch section 44. Stereo digital audio signals input to the stereo digital input unit (including an input card) 42 are also input to the input patch section 44. The digital mixer 1 also includes an internal effecter unit 43 composed of eight effecters, and each signal imparted with an effect via the internal effecter unit 43 is also passed to the input patch section 44. Further, signals of eight mixing output channels and twelve AUX output channels, output from an output channel section 51, can also be passed to the input patch section 44.

The input patch section 44 can patch (couple) a plurality of input signals to respective input channels of an input channel section 45 having, for example, 96 channels. Each of the input channels of the input channel section 45 is provided with a noise gate, compressor, delay element, fader and level adjuster for adjusting a level of a signal to be output to the MIX and AUX bus units 46 and 49. As will be later described in detail, frequency characteristics of the signal and level of the signal with which the signal is to be output to the MIX and AUX bus units 46 and 49 are controlled in each of the input channels. Digital signals of 96 channels output from the input channel section 45 are each selectively supplied to one or more of eight MIX buses 46, as well as to a stereo bus unit (Stereo_L/R) unit 47 having left (L) and right (R) buses, solo bus unit (SOLO_L/R) unit 48 having left (L) and right (R) buses and one or more of twelve AUX buses 49.

The MIX bus unit 46 perform mixing, via its eight MIX buses, on the selectively-input digital signals of the 96 channels in accordance with a mixing program, and then it supplies a total of eight different mixed (MIX output) signals to an output channel section 51 including eight MIX output channels and twelve AUX output channels. In this way, it is possible for the digital mixer 1 to provide a maximum of eight different mixed (MIX output) signals of eight channels, i.e. signals mixing-processed in eight different manners. The output signals from the MIX bus unit 46 include ultimate surround output signals. The AUX bus unit 49 performs mixing, via its twelve AUX buses, on the selectively-input digital signals of the 96 channels in accordance with a mixing program, and then it supplies AUX output signals of twelve channels to the output channel section 51. In this way, it is possible for the digital mixer 1 to provide a maximum of twelve different mixing-processed (AUX output) signals of twelve channels, i.e. signals mixing-processed in twelve different manners. The output signals from the AUX bus unit 49 include intermediate surround output signals, which are delivered, for example, to the internal effecter unit 43. As will be later described, the output channel section 51 includes 20 (8+12) output channels each equipped with an equalizer, compressor, delay element, fader, etc.

The stereo bus unit 47 performs mixing on the digital signals of the 96 channels, having been input to its left and right buses, in accordance with a mixing program, and then it outputs stereo mixing-processed output signals of one channel to a stereo output channel section 50. The solo bus unit 48 performs mixing, via its left and right buses, on digital signals of one or more channels selected via the panel operator unit 28 which are among those signals of the 96 channels having been input to the left and right buses, and it outputs the mixing-processed signals to a monitoring mixer 59 so that the output signals of the individual input channels can be monitored by the monitoring mixer 59 although not specifically shown.

The two-channel stereo signals output from the stereo output channel section 50 and the MIX and AUX output signals of the 20 (8+12) channels from the output channel section 51 are selectively input to a matrix output channel section 52, which performs mixing on the input signals to produce matrix output signals of four channels. The matrix output channel section 52 includes four output channels each provided with an equalizer, compressor, delay element, fader, etc. Different control is performed for each of the output channels in the matrix output channel section 52, so that the matrix output channel section 52 can provide different matrix output signals of four channels.

The stereo mixing-processed signals of two channels output from the stereo output channel section 50, the MIX and AUX output signals of the (8+12) channels output from the output channel section 51 and the matrix output signals of four channels from the matrix output channel section 52 are supplied to an output patch section 53. The output patch section 53 patches (couples) each of the supplied digital signals to any of an analog output unit (including a card) 54, stereo analog output unit (including a card) 55, stereo digital output unit (including a card) 56 and internal effecter unit (including eight effecters) 43. The internal effecter unit 43 imparts an effect, such as reverberation, echo or chorus, to the digital audio signals. The internal effecter unit 43 is implemented by the DSPs constituting the signal processing section 24. As stated above, output signals from the internal effecter unit 43 can be not only transferred to the input patch section 44 but also sent back to the output patch section 53.

Digital output signals supplied to the analog output unit (including a card) 54 and stereo analog output unit (including a card) 55 are each converted into analog representation via respective D/A converters contained in the output units 54 and 55. The analog signals thus output from the output units 54 and 55 are amplified by the amplifiers 10 and then audibly reproduced or sounded by the speakers 11. Further, the digital audio signals output from the stereo digital output unit 56 are supplied to the 8-track master recorder 7, DAT (Digital Audio Tape) or the like for digital recording.

When the AUX output signals of one or more channels are to be supplied to an external effecter, it is only necessary that the external effecter be connected to the analog output unit 54 or stereo digital output unit 56 and the output patch section 53 patch (couple) the signals of the one or more channels to the output unit 54 or 56 thus connected with the external effecter. Further, when signals processed by the external effecter are to be input to one or more input channels of the digital mixer 1, it is only necessary that the external effecter be connected to the analog input unit 40 or stereo digital input unit 42 and the input patch section 44 patch (couple) the connected input unit 40 or 42 to the one or more channels. The internal effecter unit 43 and external effecter 9 are constructed to be able to impart an effect to signals of a plurality of channels. For example, the internal effecter unit 43 and external effecter 9 may include a one-input/six-output reverberator, two-input/two-output three band limiter, compressor, expander, and four-input/four-output reverberator and compressor. Whereas some types of external effecters can impart auto-panning, chorus, flange and symphonic effects specific to the 5.1-channel mode, let it be assumed that the external effecter 9 employed in the embodiment is not equipped with the functions of the 5.1-channel, 6.1-channel and 7.1-channel modes. Let it also be assumed that the internal effecter unit 43, implemented by the DSPs constituting the signal processing section 24 as noted above, is not equipped with the functions of the 5.1-channel, 6.1-channel and 7.1-channel modes.

Note that the digital mixer 1 of the present invention can selectively monitor any one or more of the stereo output signals of two channels produced from the stereo output channel section 50, MIX and AUX output signals of (8+12) channels produced from the output channel section 51 and the matrix output signals of four channels produced from the matrix output channel section 52. Which of the above-mentioned output signals should be monitored is selected by a monitoring selector 58, and the thus-selected to-be-monitored signals are subjected to a mixing process by the monitoring mixer 59. The mixing-processed signals output from the monitoring mixer 59 are each converted into an analog signal via a monitoring analog output unit 60 and then output via a monitoring speaker or monitoring headphones.

Figure 4A:
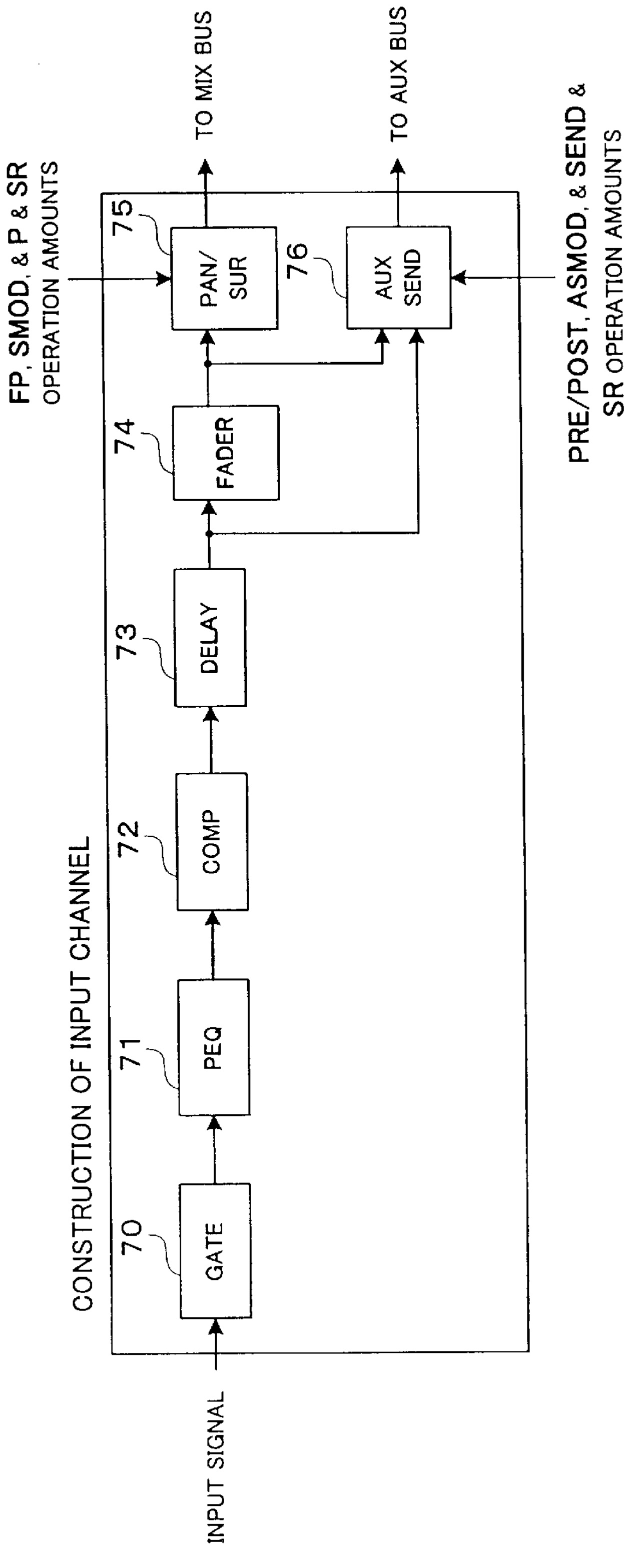
FIGS. 4A and 4B are block diagrams showing respective construction of input and output channels in the digital mixer of the present invention.

FIG. 4A shows an example of construction of each of the input channels in the input channel section 45 of FIG. 3.

As shown in FIG. 4A, each of the input channels in the input channel section 45 comprises a noise gate (GATE) 70, parametric equalizer (PEQ) 71, compressor (COMP) 72, delay element (DELAY) 73 and fader 74 which are connected together in a cascade fashion. Output signal from the fader 74 is delivered to a panning/surround level control section 75, and input and output signals to and from the fader 74 are supplied to an AUX send-level control section 76. Here, the noise gate 70 functions to remove noise from the input digital audio signal; once the level of the input digital audio signal has fallen below a predetermined reference value, the noise gate rapidly lowers the gain of the input signal to thereby remove the noise therefrom. The parametric equalizer 71, which functions to adjust the frequency characteristics of the input digital audio signal, comprises, for example, a four-band equalizer so that it can vary the input signal frequency characteristics for each of four frequency bands: a high frequency band (HI); medium-high frequency band (MID HI); medium-low frequency band (MID LOW); and low frequency band (LOW). The compressor 72 functions to narrow a dynamic range of the input digital audio signal to thereby prevent saturation of the input signal. The delay element 73 time-delays the input digital audio signal so as to compensate for a distance between the sound source and the microphone.

The reference value used in the gate 70, equalizing characteristics of the parametric equalizer 71, compressing characteristics of the compressor 72, delaying characteristics of the delay element 73, etc. are variably controlled via the operator unit 28. The fader 74, which may be included in the electric fader unit 27, is a level control means for controlling the send or delivery level of the signal to be delivered to the MIX bus unit 46. The panning/surround level control section 75 controls the levels of digital signals to be output to the MIX bus unit 46, in accordance with an operated amount of a panning operator or surround operator, included in the operator unit 28 and operable to adjust sound image localization, and in accordance with a currently-selected surround mode (SMOD). The panning/surround level control section 75 includes eight panning/surround level controls for individually controlling the level of the signal to be output to BUS 1–BUS 8 of the MIX bus unit 46. Note that for any of BUS 1–BUS 8 to which no signal is to be output from the input channel, the signal level is set to "0". The AUX send-level control section 76 selects either one of the input and output signals to and from the fader 74 in accordance with a selection signal (PRE/POST), and, for each of the AUX buses designated as signal destinations, the AUX send-level control section 76 performs signal level control in accordance with an operated amount of a send operator and currently-selected AUX surround mode (ASMOD). The AUX send-level control section 76 comprises 12 AUX send-level controls for individually controlling the send level of the signal to be sent to BUS 1–BUS 12 of the AUX bus unit 49. Note that turning on a later-described "follow surround mode" can cause the operated amount of the send operator to follow the operated amount of the surround operator. Basically, parameters supplied to each of the above-described input channels are independent of parameters supplied to the other input channels except for the surround mode (SMOD) and AUX surround mode (ASMOD) set for the entire system. However, by setting a pair or gang (group) of the input channels, it is possible to interlock one or more parameters between the pair or group of the input channels.

Figure 4B:
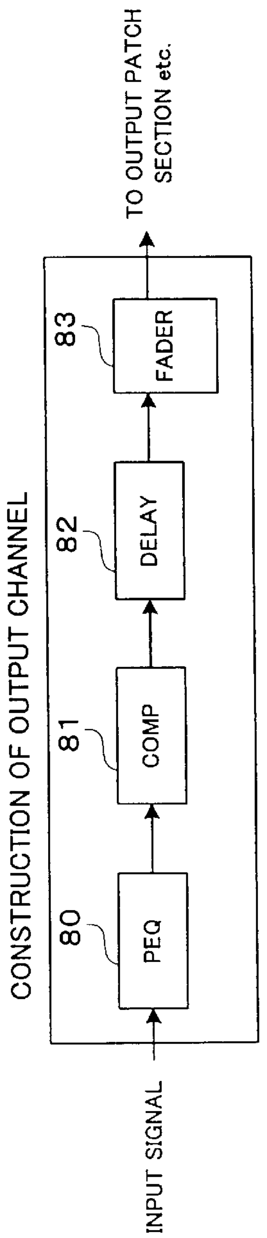

FIG. 4B shows an example of construction of each of the output channels in the stereo output channel section 50, output channel section 51 and matrix output channel section 52 of FIG. 3.

As shown in FIG. 4B, each of the output channels comprises a parametric equalizer (PEQ) 80, compressor (COMP) 81, delay element (DELAY) 82 and fader 83 which are connected together in a cascade fashion. The parametric equalizer 80, which adjusts the frequency characteristics of a digital audio signal to be output, comprises, for example, a six-band equalizer so that it can vary electrical characteristics of signal for each of six frequency bands: a high frequency band (HI); medium-high frequency band (MID HI); medium frequency band (MID); medium-low frequency band (MID LOW); low frequency band (LOW); and sub-medium frequency band (SUB MID). The compressor 81 functions to narrow a dynamic range of the to-be-output digital audio signal to thereby prevent saturation of the digital audio signal. The delay element 82 delays the to-be-output digital audio signal so as to compensate for a distance between the sound source and the microphone. Here, the equalizing characteristics of the parametric equalizer 80, compressing characteristics of the compressor 81, delaying characteristics of the delay element 82, etc. are variably controlled via the operator unit 28. The fader 83, which may be included in the electric fader unit 27, is a level control means for controlling the output level of the signal to be sent to the output patch section 53. Basically, parameters supplied to each of the above-described output channels are independent of parameters supplied to the other output channels. However, by setting a pair or gang (group) of the output channels, it is possible to interlock one or more parameters between the pair or group of the output channels.

The following paragraphs describe a surround mode setting process performed in the digital mixer 1 of the present invention, with reference to various screens displayed on the display device 26.

Figure 5:
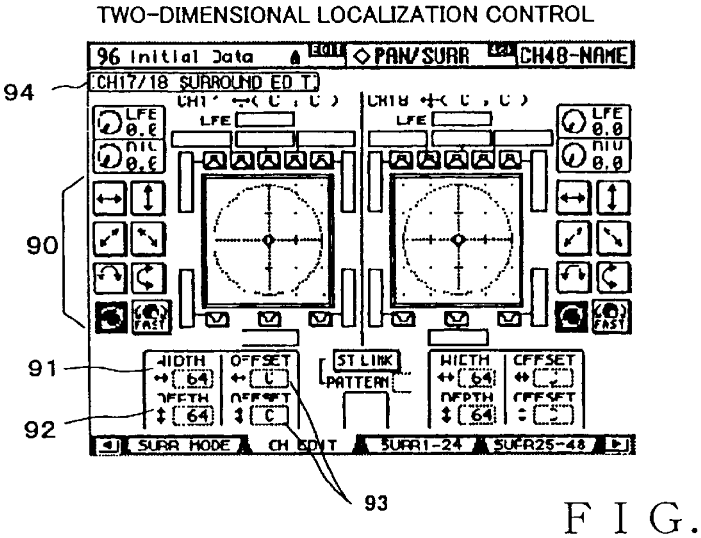
FIG. 5 is a diagram showing a screen displayed on a display device of the digital mixer when two-dimensional localization control is to be performed on sound images in the input channels.

FIG. 5 shows a two-dimensional localization control screen displayed on the display device 26 when two-dimensional localization control is carried out on a sound image in each of the input channels during the surround mode setting process. The screen of FIG. 5 shows screen sections of two adjoining input channels, the screen section of an odd-numbered input channel on a left half portion of the screen and the screen section of an even-numbered input channel on a right half portion of the screen. Specifically, in the illustrated example of FIG. 5, "CH17/18" is indicated in a "CH NO." area 94, and the two-dimensional localization control screen sections for channel 17 (CH17) and channel 18 (CH18) are displayed. By changing the channel numbers shown in the "CH NO." area 94, the two-dimensional localization control can be carried out for each one of the input channels of the digital mixer 1. The two-dimensional localization control can be performed in a different manner depending on the type of the surround operators employed. In the case where a rotary encoder is used as the surround operator, any one of seven localization-trajectory selection buttons 90 is selectively operated by the user. In the illustrated example of FIG. 5, one of the localization-trajectory selection buttons 90, which is intended to achieve a circular localization trajectory, has been selected for both of the channels CH17 and CH18. In this case, as the rotary encoder is turned rightward or clockwise, the sound image localizing position of the channel in question moves clockwise along a circular path as shown in (b) of FIG. 6. Conversely, as the rotary encoder is turned leftward or counterclockwise, the sound image localizing position of the channel moves counterclockwise along the circular path shown in (b) of FIG. 6. In this manner, the sound image localizing positions of the individual channels can be adjusted.

Figure 6:
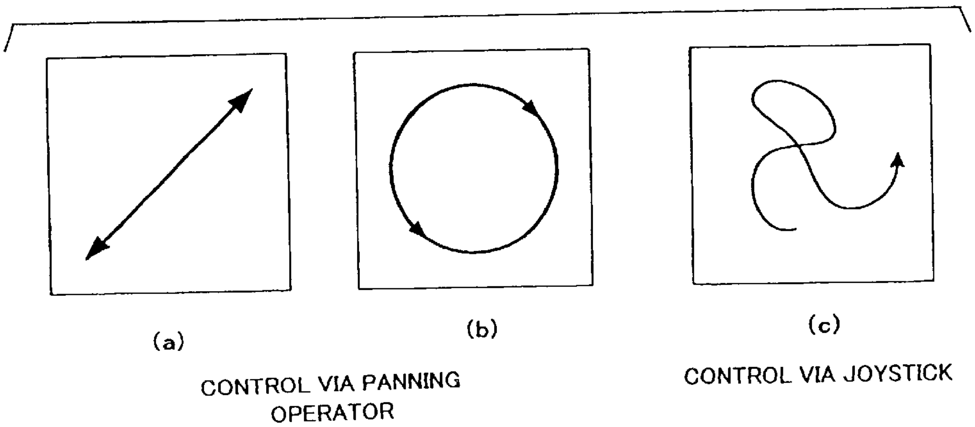
FIG. 6 is a diagram showing localizing trajectories when two-dimensional sound image localization control is to be performed in the digital mixer of the present invention.

When the localization-trajectory selection button 90 with a right-side-up oblique line indicated thereon is operated by the user, the sound image localizing position of the channel can be moved along the right-side-up oblique line as shown in (a) of FIG. 6. For example, as the rotary encoder is turned clockwise, the sound image localizing position of the channel moves rightward upward along the right-side-up oblique line. Conversely, as the rotary encoder is turned counterclockwise, the sound image localizing position of the channel moves leftward downward along the oblique line. Further, the shape and position of the trajectory selected by the localization-trajectory selection button 90 can be varied within a predetermined range. The horizontal dimension (width) of the trajectory can be controlled by changing a value in a WIDTH area 91 of the screen through operation of a ten-button keypad, and the vertical dimension (height) of the trajectory can be controlled by changing a value in a DEPTH area 92 of the screen through operation of the ten-button keypad. Further, the center position of the trajectory can be controlled by changing values in horizontal and vertical OFFSET areas 93 of the screen through operation of the ten-key numeric keypad.

In the case where a joystick is used as the surround operator, the sound image localizing position can be moved to a desired position, as shown in (c) of FIG. 6, in response to manipulation of the joystick.

Figure 7:
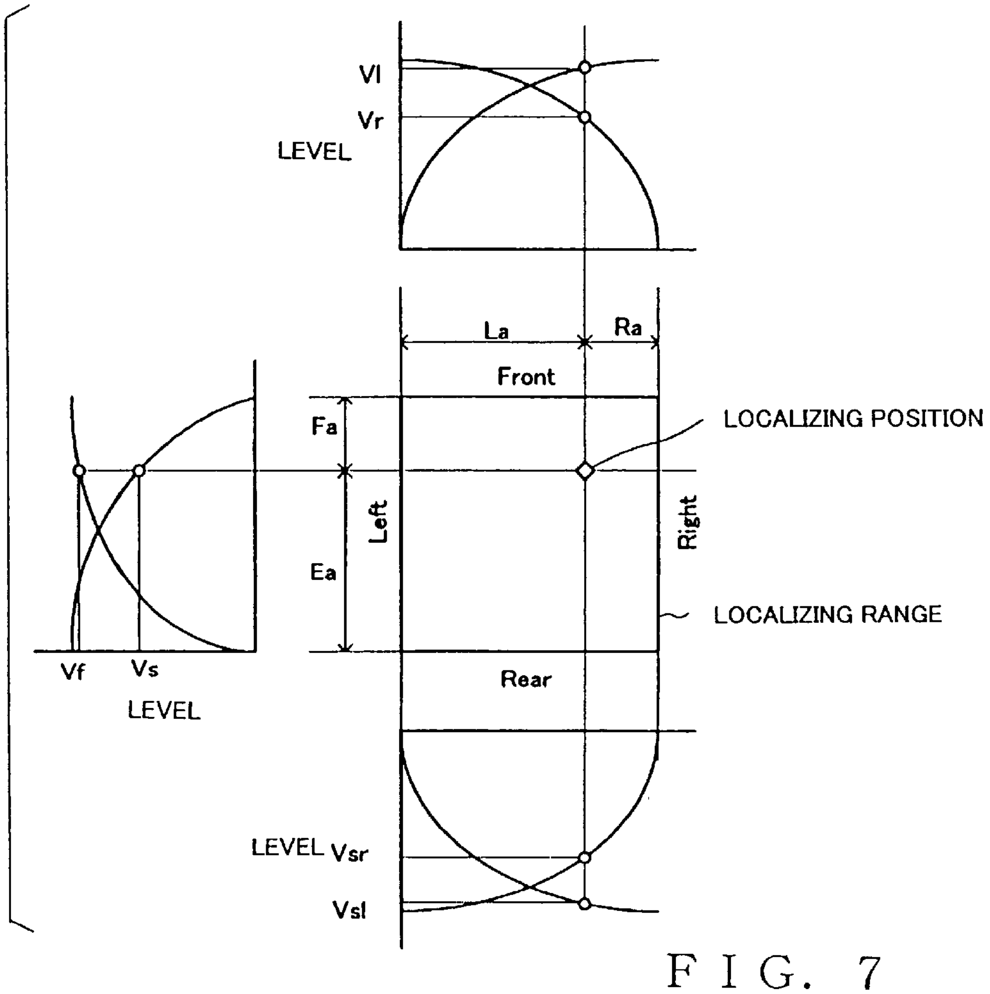
FIG. 7 is a diagram explanatory of principles on the basis of which the digital mixer determines a signal level corresponding to a sound image localizing position.

By performing sound image localization operations with the screen of FIG. 5 displayed on the display device 26, the output level of the signal of each of the channels to be output to the MIX bus unit 46 can be changed; when the follow surround mode is ON, the send level of the signal to be sent to the AUX bus unit 49 can also be changed. The output level of the signal of each of the channels to be output to the MIX bus unit 46 is controlled by the panning/surround level control section 75 of FIG. 4 in accordance with a designated sound image localizing position corresponding to an operated amount of the corresponding surround operator. Further, when the follow surround mode is ON, the send level of the signal to be sent to the AUX bus unit 49 is controlled by the AUX send level control section 76 in accordance with a designated sound image localizing position corresponding to the operated amount of the corresponding surround operator. Here, let it be assumed that the surround operator has been operated for one of the channels within a localizing range of FIG. 7 so that the sound image of that channel has been localized at a position "A" of FIG. 7. Two-dimensional sound localization is controlled on the basis of the principles of tone volume distribution in the (2+2)-channel surround mode of FIG. 16B. For example, level distribution between the left and right channels is effected as indicated by Vl and Vr of FIG. 7 and level distribution between the front and rear channels is effected as indicated by Vf and Vs of FIG. 7, in accordance with $\sin^2$ and $\cos^2$ curves. Thus, a sum of energy of these channels is kept constant. Thus, the output levels to the left front speaker channel L and right front speaker channel R become (Vl×Vf) and (Vr×Vf), respectively. Similarly, the output levels to the left rear speaker channel Ls and right rear speaker channel Rs become (Vl×Vs) and (Vr×Vs), respectively.

In the 5.1-channel surround mode shown in FIG. 16D, it suffices to distribute the tone volume, distributed between the left and right front speaker channels L and R in the (2+2)-channel surround mode, among the left, right and center front speaker channels L, R and C. In such tone volume distribution, arithmetic operations as disclosed in Japanese Patent Laid-open Publication No. HEI-10-290500 may be performed to determine the output levels to the left, right and center front speaker channels L, R and C. Further, the level of the signal to be output to the woofer speaker channel LFE is controlled via a woofer-speaker control operator (hereinafter called an "LFE control operator"). Namely, the "follow surround" is intended to automatically set signal levels in the AUX surround mode (ASMOD), in response to (i.e., in such a manner as to follow) respective level settings at individual localizing positions set in the system plus send level settings of the system's surround mode (SMOD). Therefore, the follow surround mode is also referred to as a "localization-following surround mode".

Note that the output levels to the individual speaker channels are equivalent to the output levels to two or more buses of the MIX bus unit 46 via which final surround output signals are output, and the output levels to the individual speaker channels, determined in the above-mentioned manner, become output levels of signals to be output from the respective panning/surround level control sections 75 to the MIX bus unit 46. Calculation of such output levels is automatically performed by the DSPs of the signal processing section 24 in response to operation of the surround operators of the individual channels, change of the surround mode or the like, so that output levels of surround signals to be output from the panning/surround level control sections 75 are determined.

The following paragraphs describe specific operations performed by the digital mixer 1 of FIG. 3 to provide surround output signals.

Let it be assumed here that surround output signals of the 5.1-channel surround mode are obtained using input digital signals of four input channels (INPUT 1–INPUT 4) from among digital signals input to the input patch section 44. Thus, the input digital signals are patched to the respective input channels of the input patch section 44. For example, the input digital signals of INPUT 1, INPUT 2, INPUT 3 and INPUT 4 are patched to CHANNEL 1, CHANNEL 2, CHANNEL 3 and CHANNEL 4, respectively, of the input patch section 44. Then, in each of the input channels of the input patch section 44, the digital signal is controlled not only in its equalizing, compressing and delay characteristics but also in its output level with which it is to be output to the MIX bus unit 46. Because the 5.1-channel surround mode is ON in the illustrated example, the signals of the individual input channels are sent to six buses (BUS 1–BUS 6) of the MIX bus unit 46 which correspond to the speaker channels L, C, R, Ls, Rs and LFE of the 5.1-channel surround mode. Therefore, the output levels to the six buses (BUS 1–BUS 6) of the MIX bus unit 46 are controlled by the panning/surround level control sections 75 of the respective input channels in accordance with operated amounts of the surround operators, selected surround mode (SMOD) and corresponding speaker channels.

In the instant embodiment, the buses of the MIX bus unit 46 are allocated to the surround channels in a manner as illustrated in FIG. 13. Namely, when the 5.1-channel surround mode is set or ON, BUS 1 of the MIX bus unit 46 is allocated to the left front speaker channel L, BUS 2 allocated to the right front speaker channel R, BUS 3 allocated to the left rear speaker channel Ls, BUS 4 allocated to the right rear speaker channel Rs, BUS 5 allocated to the center front speaker channel C, and BUS 6 allocated to the woofer speaker channel LFE. Allocation, to the surround channels, of the buses of the MIX bus unit 46 when other surround modes are ON is also shown in FIG. 13. Note that each bus not used in the selected surround modes can be used for another desired purpose or a pair of adjoining odd- and even-numbered buses may be assigned to stereo mixing.

Because of such allocation, to the speaker channels, of the buses of the MIX bus unit 46, the signals of INPUT CHANNEL 1–INPUT CHANNEL 4, each having been controlled in accordance with an output level of the left front speaker channel L, are output, for example, to BUS 1 of the MIX bus unit 46. Similarly, the signals of INPUT CHANNEL 1–INPUT CHANNEL 4, each having been controlled in accordance with an output level of the right front speaker channel R, are output to BUS 2 of the MIX bus unit 46, the signals of INPUT CHANNEL 1–INPUT CHANNEL 4, each having been controlled in accordance with an output level of the left rear speaker channel Ls, are output to BUS 3 of the MIX bus unit 46, and the signals of INPUT CHANNEL 1–INPUT CHANNEL 4, each having been controlled in accordance with an output level of the right rear speaker channel Rs, are output to BUS 4 of the MIX bus unit 46. Further, the signals of INPUT CHANNEL 1–INPUT CHANNEL 4, each having been controlled in accordance with an output level of the center front speaker channel C, are output to BUS 5 of the MIX bus unit 46, and the signals of INPUT CHANNEL 1–INPUT CHANNEL 4, each having been controlled in accordance with an output level of the woofer speaker channel LFE, are output to BUS 6 of the MIX bus unit 46.

The output signals of the four input channels are subjected to the mixing process via BUS 1–BUS 6 of the MIX bus unit 46, so that six-channel MIX signals, corresponding to the speaker channels L, C, R, Ls, Rs and LEF, are output to the output channel section 51. Then, the output channel section 51 controls the signals to have equalizing, compressing and delay characteristics corresponding to the speaker channels L, C, R, Ls, Rs and LEF, and the thus-controlled signals are patched to and then output via the outputs of the output patch section 53 corresponding to the speaker channels L, C, R, Ls, Rs and LEF. As a consequence, the speakers L, C, R, Ls, Rs and LEF are driven by the output signals of the respective speaker channels L, C, R, Ls, Rs and LEF, which can thereby produce a sound field full of realism.

Let's now consider a case where the 5.1-channel surround mode is set or ON and an effect is to be imparted to surround output signals of the 5.1-channel surround mode. When an effect is to be imparted by the digital mixer 1, the user connects the internal effecter unit 43 or external effecter 9 to the output patch section 53 and input patch section 44 as may be necessary, and selects a desired effect from the connected internal effecter unit 43 or external effecter 9. Here, assume that the user has operated the internal effecter unit 43, having no effect of input construction corresponding to the 5.1-channel surround mode, to select an effect of input and output channel construction corresponding to the (2+2)-channel surround mode. In this case, the input digital signals of INPUT 1, INPUT 2, INPUT 3 and INPUT 4 are patched to INPUT CHANNEL 1, INPUT CHANNEL 2, INPUT CHANNEL 3 and INPUT CHANNEL 4, respectively, of the input patch section 44, as having been described in relation FIG. 3, and mixing of the 5.1 channels is performed via BUS 1–BUS6 of the MIX bus unit 46.

Here, the AUX surround mode (ASMOD) is set to the (2+2)-channel surround mode in conformity with the input construction of the selected effecter, and the follow surround modes of BUS 1–BUS 4 of the AUX bus unit 49 are turned on so that the AUX bus unit 49 performs mixing of the (2+2)-channel surround mode conforming to the input construction of the selected effecter. The mixed signals of the 5.1 channels output from the MIX bus unit 46 and the mixed signals of the (2+2) channels output from the AUX bus unit 49 are identical to each other in their localizing position but differ from each other in their surround mode. The mixed signals of the (2+2) channels output from the AUX bus unit 49 are then supplied to the output channel section 51. Then, the output channel section 51 controls the signals to have equalizing, compressing and delay characteristics corresponding to the speaker channels L, R, Ls, Rs of the (2+2) channels, and the thus-controlled signals are patched to and then output via the outputs of the output patch section 53 corresponding to the internal effecter unit 43. As a consequence, the internal effecter unit 43 imparts the selected effect to the respective channels and then outputs the signals of the (2+2) channel construction.

The effect-imparted signals output from the internal effecter 43 are then patched to the respective input channels of the input patch section 44. For example, the left channel L of the (2+2) channels is patched to CHANNEL 8 of the input patch section 44, the right channel R patched to CHANNEL 9, the left rear channel Ls patched to CHANNEL 10, and the right rear channel Rs patched to CHANNEL 11. Then, the equalizing, compressing and delay characteristics are controlled in the individual input channels, and also the output levels to the AUX bus unit 49 are controlled. In this case, the output signal of CHANNEL 8 receiving the left channel (L) signal is delivered to the left front speaker channel L (BUS 1 of the MIX bus unit 46) and center speaker channel C (BUS 5 of the MIX bus unit 46) while the output signal of CHANNEL 9 receiving the right channel (R) signal is delivered to the right front speaker channel R (BUS 2 of the MIX bus unit 46) and center speaker channel C (BUS 5 of the MIX bus unit 46), after the signals of CHANNEL 8 and CHANNEL 9 have been subjected to appropriate level control to take on a same level. Further, the output signal of CHANNEL 10 receiving the left rear channel (Ls) signal is delivered to the left rear speaker channel Ls (BUS 3 of the MIX bus unit 46) while the output signal of CHANNEL 11 receiving the right rear channel (Rs) signal is delivered to the right rear speaker channel Rs (BUS 4 of the MIX bus unit 46), after the signals of CHANNEL 10 and CHANNEL 11 have been subjected to appropriate level control.

Such allocation of the signals are effected by appropriately adjusting respective sound-image localizing positions of the individual input channels. Further, the output signals of INPUT CHANNEL 8–INPUT CHANNEL 11 are delivered to the woofer speaker channel LFE (BUS 6 of the MIX bus unit 46) at levels corresponding to operated amounts of the LFE operators of the individual channels. Note that it is necessary to previously place all of the outputs, to the AUX bus unit 49, of INPUT CHANNEL 8–INPUT CHANNEL 11 in an OFF state. Then, by operating the faders 74 of INPUT CHANNEL 8–INPUT CHANNEL 11, it is possible to control degree or depth of the selected effect on the 5.1-channel signals to be subjected to the mixing process via the MIX bus unit 46.

Here, it is possible to set whether or not the send level of each of the buses in the AUX bus unit 49 should be caused to follow a surround mixing localizing position in the MIX bus unit 46. If the user wants to cause the send level to follow the surround mixing localizing position in the MIX bus unit 46, he or she sets the follow surround mode of the corresponding bus to an ON state. Such ON/OFF setting of the follow surround mode can be made in a manner as illustrated in FIG. 14. When the (2+2)-channel AUX surround mode is set as in the foregoing case, the follow surround mode can be set for a pair of BUS 1 (AUX 1) and BUS 2 (AUX 2) of the AUX bus unit 49, and the follow surround mode can be set for another pair of BUS 3 (AUX 3) and BUS 4 (AUX 4) of the AUX bus unit 49. When any one of the other surround modes is used, the ON/OFF setting of the follow surround mode can be made on pairs of the buses of the AUX bus unit 49, as illustrated in FIG. 14.

When the follow surround mode is turned on, the buses of the AUX bus unit 49 are allocated to the surround channels in a manner as shown in FIG. 15. Namely, when the (2+2)-channel AUX surround mode is set, BUS 1 (AUX 1) of the AUX bus unit 46 is allocated to the left front speaker channel L, BUS 2 (AUX 2) allocated to the right front speaker channel R, BUS 3 (AUX 3) allocated to the left rear speaker channel Ls, and BUS 4 (AUX 4) allocated to the right rear speaker channel Rs. Allocation, to the surround channels, of the buses of the AUX bus unit 49 when other surround modes are ON is also shown in FIG. 15.

As having been described above, where the system's surround mode (SMOD: the surround mode of the MIX bus unit 46 for producing ultimate output signals) and the input construction of the selected effect differ from each other, the AUX bus unit 49 in the digital mixer 1 of the present invention can perform mixing corresponding to the input construction of the selected effect in the AUX surround mode (ASMOD) other than the system's surround mode.

Figure 8:
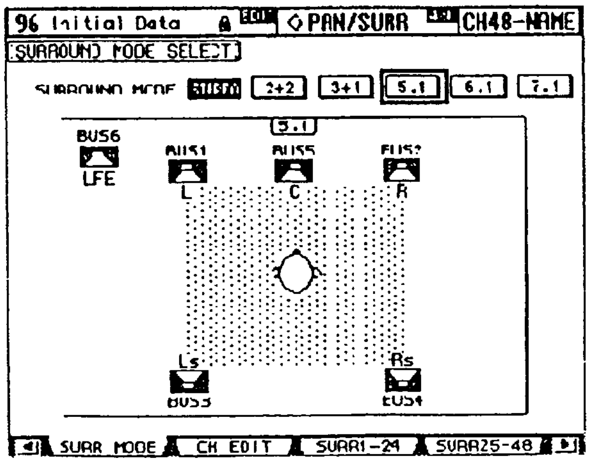
FIG. 8 is a diagram shows a screen displayed on the display device in response to selection of a 5.1-channel mode on a surround mode-selecting screen in the digital mixer.
Figure 9:
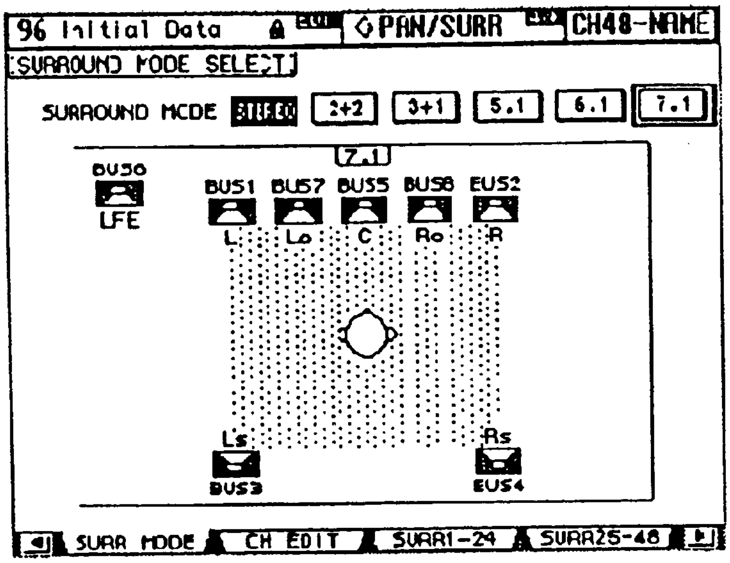
FIG. 9 is a diagram showing a screen displayed on the display device in response to selection of a 7.1-channel mode on the surround mode-selecting screen in the digital mixer.

FIGS. 8 and 9 show screens for setting a surround mode. Specifically, FIG. 8 shows a surround mode selecting screen displayed on the display device 26 in response to user's clicking of a "SURR MODE" tab. The surround mode selecting screen of FIG. 8 indicates arrangement of the speakers and BUS 1–BUS 6 of the MIX bus unit 46 which are allocated to the speaker channels L, C, R, Ls, Rs and LFE in response to user selection of the 5.1-channel surround mode. As seen from the surround mode selecting screen, the six speakers L, C, R, Ls, Rs and LFE are arranged in the manner as illustrated in the figure, when the 5.1-channel surround mode has been selected.

FIG. 9 shows a surround-mode setting screen displayed on the display device 26 in response to user selection of the "7.1"-channel surround mode on the surround mode selecting screen of FIG. 8. The surround-mode setting screen of FIG. 9 indicates arrangement of the speakers and BUS 1–BUS 8 of the MIX bus unit 46 allocated to the speaker channels L, Lo, C, Ro, R, Ls, Rs and LFE in the 7.1-channel surround mode. As seen from the screen, the eight speakers L, Lo, C, Ro, R, Ls, Rs and LFE are arranged in the manner as illustrated in the figure, when the 7.1-channel surround mode has been selected.

Figure 10:
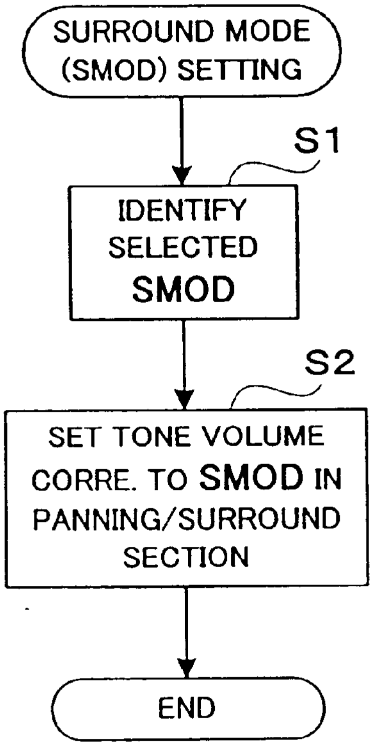
FIG. 10 is a flow chart of a surround mode setting process performed in the digital mixer of the present invention.

FIG. 10 is a flow chart showing a surround mode setting process performed by the digital mixer 1.

Once the surround mode setting process is initiated with the surround-mode setting screen displayed on the display device 26, a surround mode (SMOD) selected by the user is read and identified at step S1. At next step S2, output levels to the buses of the MIX bus unit 46, corresponding to the identified selected surround mode, are set in the panning/surround level control sections 75 of all the input channels in the digital mixer 1. Thus, the MIX bus unit 46 produces mixed signals corresponding to the selected surround mode, which are adjusted by the MIX output channel section and then output to the output channel section 53. The output channel section 53 patches (couples) the adjusted mixed signals from the MIX output channel section to the analog output unit 54 connected with the speakers arranged in accordance with the selected surround mode, so that the speakers can produce a sound field full of realism.

The following paragraphs describe tone volume control performed by the panning/surround level control sections 75 of the digital mixer 1 for each selected surround mode (SMOD).

[SMOD=0: Stereo]

If a follow panning (FP) mode is ON, signals obtained by subjecting input signals to panning tone volume control corresponding to a panning operation amount are delivered to the MIX bus unit 46. In this case, adjoining odd-numbered and even-numbered buses of the MIX bus unit 46 are set as left (L) and right (R) channels, respectively. If, on the other hand, the follow panning mode is OFF, the input signals are delivered to the respective buses of the MIX bus unit 46 directly as they are.

[SMOD=1: (2+2)-Channel]

Signals obtained by subjecting input signals to (2+2)-channel tone volume control corresponding to operated amounts of the surround operators (SR operation amounts) are delivered to BUS 1–BUS 4 of the MIX bus unit 46. In this case, BUS 5–BUS 8 of the MIX bus unit 46 are set in the same manner as in the above-described stereo mode. Namely, in this case, predetermined four buses, BUS 1–BUS 4, of the eight buses of the MIX bus unit 46 are used for the (2+2)-channel surround mixing, and the remaining four buses, BUS 5–BUS 8, can be used after tone volume control is performed as in the stereo mode.

[SMOD=2: (3+1)-Channel]

Signals obtained by subjecting input signals to (3+1)-channel tone volume control corresponding to operated amounts of the surround operators (SR operation amounts) are delivered to BUS 1–BUS 4 of the MIX bus unit 46. In this case, predetermined four buses, BUS 1–BUS 4, of the eight buses of the MIX bus unit 46 are used for the (3+1)-channel surround mixing, and the remaining four buses, BUS 5–BUS 8, can be used after tone volume control is performed as in the stereo mode.

[SMOD=3: 5.1-Channel]

Signals obtained by subjecting input signals to 5.1-channel tone volume control corresponding to operated amounts of the surround operators are delivered to BUS 1–BUS 6 of the MIX bus unit 46. In this case, predetermined six buses, BUS 1–BUS 6, of the eight buses of the MIX bus unit 46 are used for the 5.1-channel surround mixing, and the remaining two buses, BUS 7 and BUS 8, can be used after tone volume control is performed as in the stereo mode.

[SMOD=4: 6.1-Channel]

Signals obtained by subjecting input signals to 6.1-channel tone volume control corresponding to operated amounts of the surround operators are delivered to BUS 1–BUS 7 of the MIX bus unit 46. In this case, predetermined seven buses, BUS 1–BUS 7, of the eight buses of the MIX bus unit 46 are used for the 5.1-channel surround mixing, and the remaining bus, BUS 8, can be used after tone volume control is performed as in the stereo mode.

[SMOD=5: 7.1-Channel]

Signals obtained by subjecting input signals to 7.1-channel tone volume control corresponding to operated amounts of the surround operators are delivered to BUS 1–BUS 8 of the MIX bus unit 46.

Figure 11:
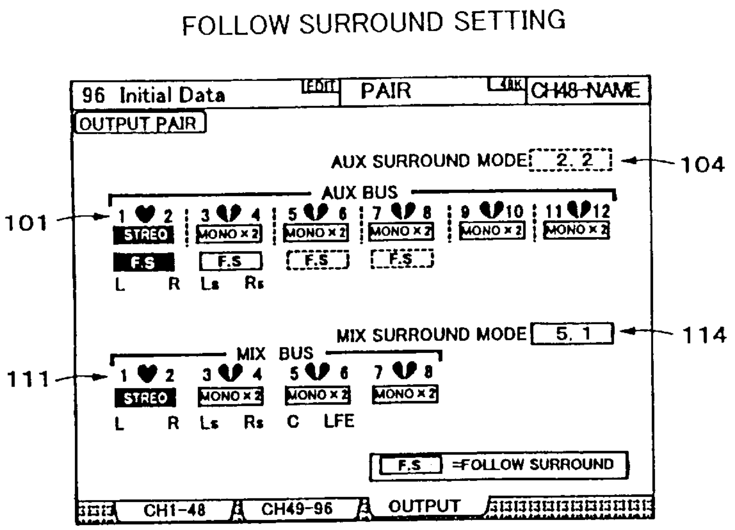
FIG. 11 is a flow chart of a follow surround mode setting process performed in the digital mixer of the present invention.

FIG. 11 shows a follow-surround-mode setting screen that is displayed on the display device 26 in response to user's clicking of an "OUTPUT" tab on the surround-mode setting screen. The follow-surround-mode setting screen includes a display area 104 for indicating a selected AUX surround mode; in the illustrated example, the (2+2)-channel AUX surround mode is indicated in the display area 104. This AUX surround mode is a surround mode of the AUX bus unit 49 which can be set in conformity with the input construction of an effect to be used. ON/OFF setting of the follow surround mode is set for each pair of adjoining buses of the AUX bus unit 49. On the follow-surround-mode setting screen, pairs of bus numbers are displayed in a bus number display area 101. Between and below each pair of the bus numbers are displayed channel modes indicating whether the two buses and their respective output channels are currently set as stereophonically paired elements or as monaural elements. Further, below each of the channel modes, there is displayed an ON/OFF setting of the follow surround mode.

In the area 101 of the follow-surround-mode setting screen of FIG. 11, a complete heart mark is displayed between bus numbers "1" and "2" of the AUX bus unit 49 to indicate that two output channels assigned to the two buses (BUS 1 and BUS 2) are currently set as stereophonically paired output channels. Further, for these two output channels, the follow surround mode is ON, so that the send level to the AUX bus unit 49 is controlled, for each of the input channels, in accordance with the AUX surround mode and operated amount of the surround operator of the channel. Normally, the send levels to the paired buses are controlled to match with each other; however, when the follow surround mode is ON, priority is given to send level control corresponding to the follow surround mode. Further, in the area 101 of FIG. 11, a broken heart mark is displayed between bus numbers "3" and "4" of the AUX bus unit 49 to indicate that two output channels assigned to the two buses (BUS 3 and BUS 4) are currently set as non-paired monaural output channels. Furthermore, the follow surround mode is OFF for the two buses (BUS 3 and BUS 4), so that the send levels are set independently of each other via respective send level operators of the corresponding input channels. Because predetermined four buses of the AUX bus unit 49 are used in the selected (2+2)-channel surround mode, the ON/OFF settings of output channels allocated to the remaining buses (BUS 5–BUS 12) are denoted by broken lines in the area 101, which indicates that the ON/OFF setting of the follow surround mode can not be set for the allocated output channels as shown in FIG. 14. Note that the channels allocated to BUS 5–BUS 12 can be used for another purpose than the surround mixing.

The follow-surround-mode setting screen also shows information of a MIX surround mode set on the surround mode setting screen, as illustrated in FIG. 11; in the illustrated example of FIG. 11, the 5.1-channel MIX surround mode is being shown in a MIX surround mode area 114 of the follow-surround-mode setting screen. However, the type of the MIX surround mode can not be changed over to another on this follow-surround-mode setting screen. Further, pairs of bus numbers of the MIX bus unit 46 are displayed in another bus number display area 111. Between and below each pair of the bus numbers in the bus number display area 111 are displayed channel modes indicating whether the two buses and their respective output channels are currently set as stereophonically paired elements or as monaural elements. Below the channel mode indications are displayed speaker channels assigned to the buses.

In the area 111 of the follow-surround-mode setting screen of FIG. 11, a complete heart mark is displayed between bus numbers "1" and "2" of the MIX bus unit 46 to indicate that two output channels allocated to the two buses (BUS 1 and BUS 2) are currently set as stereophonically paired output channels. The area 111 also indicates that the channel of BUS 1 is allocated to the left front speaker channel L and the channel of BUS 2 is allocated to the right front speaker channel R. Further, in the area 111 of FIG. 11, a broken heart mark is displayed between bus numbers "3" and "4" of the MIX bus unit 46 to indicate that two output channels allocated to the two buses (BUS 3 and BUS 4) are currently set as non-paired monaural output channels. The area 111 also indicates that the channel of BUS 3 is allocated to the left rear speaker channel Ls and the channel of BUS 4 is allocated to the right rear speaker channel Rs. Further, a broken heart mark is displayed between bus numbers "5" and "6" of the MIX bus unit 46 to indicate that two output channels allocated to the two buses (BUS 5 and BUS 5) are currently set as non-paired monaural output channels. The area 111 also indicates that the channel of BUS 5 is allocated to the center front left speaker channel C and the channel of BUS 6 is allocated to the woofer speaker channel LFE. The remaining buses (BUS 7 and BUS 8) of the MIX bus unit 46 are not being used for surround mixing, which means that these buses can be used for another purpose than the surround mixing.

Figure 12A:
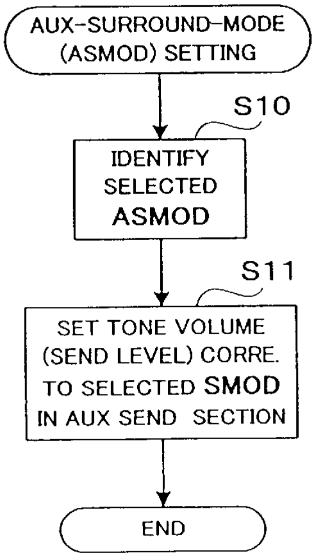
FIGS. 12A, 12B and 12C are flowcharts of an AUX-surround-mode setting process, follow-surround-mode ON process and follow-surround-mode OFF process, respectively, performed in the digital mixer of the present invention.

FIG. 12A is a flowchart of an AUX-surround-mode setting process. Once the AUX-surround-mode setting process is started up with an AUX-surround-mode setting screen displayed on the display device 26, an AUX surround mode (ASMOD) selected by the user is identified at step S10. At next step S11, send levels to the AUX buses where the follow surround is ON, among send levels of the AUX send level control sections 76 of all of the input channels as shown in FIG. 4A, are set to tone volumes corresponding to the identified selected AUX surround mode and sound image localizing positions of the individual channels. In this way, the digital mixer 1 can supply the effecter with AUX surround output signals corresponding to an AUX surround mode possessed by the effecter.

Figure 12B:
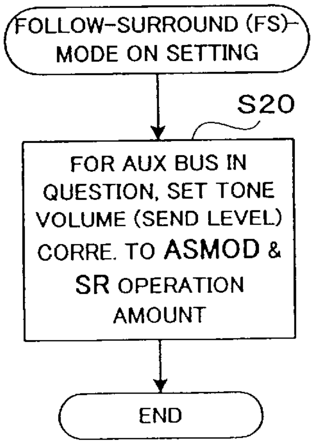

FIG. 12B is a flow chart of a follow-surround-mode ON process executed when the follow surround mode is turned on. Once the AUX-surround-mode setting screen is displayed on the display device 26 and the follow surround (FS) mode is turned on in channels allocated to a given pair of AUX buses designated as a processing unit, the follow-surround-mode ON process is started up. At step S20, send levels to the AUX buses where the follow surround is ON are set to tone volumes corresponding to the identified selected AUX surround mode (ASMOD) and operated amounts (sound image localizing positions) of the surround operators of the individual channels, for all the channels of the digital mixer 1. Then, the follow-surround-mode ON process is brought to an end. The thus-set send level control signals are supplied to the AUX send level control sections 76 of the individual channels, which can thereby supply the AUX bus unit 49 with AUX surround output signals with send levels corresponding to the AUX surround mode and operated amounts (sound image localizing positions) of the corresponding surround operators.

Figure 12C:
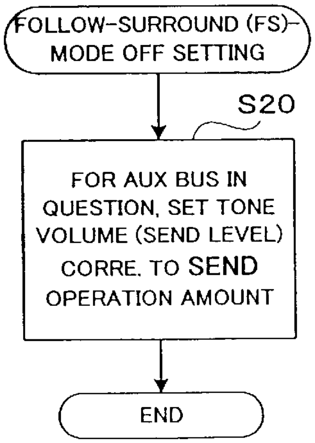

FIG. 12C is a flow chart of a follow-surround-mode OFF process executed when the follow surround mode is turned off. Once the AUX-surround-mode setting screen is displayed on the display device 26 and the follow surround (FS) mode is turned off for channels allocated to a given pair of AUX buses designated as a processing unit, the follow-surround-mode OFF process is started up. At step S30, send levels to the AUX buses where the follow surround is OFF, among the buses of the AUX bus unit 49, are set in accordance with send level (tone volume) control signals corresponding to operated amounts of the surround operators of the individual input channels, for all the channels of the digital mixer 1. Then, the follow-surround-mode OFF process is brought to an end. The thus-set send level control signals are supplied to the AUX send level control sections 76 of the individual channels, The following paragraphs describe tone volume control performed by the AUX send level control sections 76 of the digital mixer 1 for each selected AUX surround mode (ASMOD).

[ASMOD=0: Stereo]

Send levels are set on input signals for the buses of the AUX bus unit 49 independently of each other and then output to the AUX bus unit 49. However, for paired channels, the signals are output to the AUX bus unit 49 with the same send level.

[ASMOD=1: (2+2)-Channel]

For given buses of the AUX bus unit 49, signals obtained by subjecting input signals to (2+2)-channel tone volume control corresponding to operated amounts of the surround operators are delivered to AUX 1–AUX 4 of the AUX bus unit 49. In this case, the remaining buses, AUX 5–AUX 12, of the AUX bus unit 49 can be used after tone volume control is performed as in the stereo mode.

[ASMOD=2: (3+1)-Channel]

Signals obtained by subjecting input signals to (3+1)-channel tone volume control corresponding to operated amounts of the surround operators are delivered to AUX 1–AUX 4 of the AUX bus unit 49. In this case, the remaining buses, AUX 5–AUX 12, of the AUX bus unit 49 can be used after tone volume control is performed as in the stereo mode.

[ASMOD=3: 5.1-Channel]

Signals obtained by subjecting input signals to 5.1-channel tone volume control corresponding to operated amounts of the surround operators are delivered to AUX 1–AUX 6 of the AUX bus unit 49. In this case, the remaining buses, AUX 7–AUX 12, of the AUX bus unit 49 can be used after tone volume control is performed as in the stereo mode.

[ASMOD=4: 6.1-Channel]

For given buses of the AUX bus unit 49 where the follow surround mode is ON, signals obtained by subjecting input signals to 6.1-channel tone volume control corresponding to operated amounts of the surround operators are delivered to AUX 1–AUX 7 of the AUX bus unit 49. In this case, the remaining buses, AUX 8–AUX 12, of the AUX bus unit 49 can be used after tone volume control is performed as in the stereo mode.

[ASMOD=5: 7.1-Channel]

For any of the buses of the AUX bus unit 49 where the follow surround mode is ON, signals obtained by subjecting input signals to 7.1-channel tone volume control corresponding to operated amounts of the surround operators are delivered to AUX 1–AUX 8 of the AUX bus unit 49. In this case, the remaining buses, AUX 9–AUX 12, of the AUX bus unit 49 can be used after tone volume control is performed as in the stereo mode.

Note that in each of the above-mentioned AUX surround modes (ASMOD 1–ASMOD 5), those buses of the AUX bus unit 49 where the follow surround mode is OFF are set in the same manner as in the above-described stereo mode.

Whereas the preceding paragraphs have described the case where the MIX surround mode is set to the 5.1-channel type surround mode, operations similar to the above-described are carried out when any other type of the MIX surround mode is set. If, in such a case, effect-imparted surround output is to be obtained, the MIX surround mode and the AUX surround mode for sending surround signals to the effecter can be made different in type from each other. Thus, even where the currently-set MIX surround mode and the input channel construction of an effect selected by the effecter do not correspond to each other, the present invention can properly provide effect-imparted surround output. When an effect of input channel construction corresponding to the selected MIX surround mode is selected via the effecter, the AUX surround mode may be of a same type as the MIX surround mode. In such a case, the MIX bus unit 46 and AUX bus unit 49 perform mixing in the same surround mode; however, signals processed with the effect are also re-input to the MIX bus unit 46 via other input channels. Depth or effectiveness of the effect can be controlled by manipulating the faders 83 of the output channels of given buses of the AUX bus 49 that mix signals to be supplied to the effecter or manipulating the faders 74 of the input channels that re-input output signals from the effecter.

Whereas the digital mixer of the present invention has been described above as being able to set only one type of AUX surround mode at a time, the digital mixer may be arranged to be able to set two or more different types of AUX surround modes at a time. If the digital mixer is arranged to set two different AUX surround modes at a time, the AUX bus unit 49 may be designed to perform two sets of surround mixing operations corresponding to the two AUX surround modes.

As having been described above, the digital mixer of the present invention is constructed to adjust a signal to a send level corresponding to a surround mode possessed by the associated effecter and send the level-adjusted signal to the second bus so that the effecter can impart an effect to the signal received via the second bus and send the effect-imparted signal back to the first bus after adjusting the signal to an output level corresponding to a selected surround mode. Therefore, even where the selected surround mode is not possessed by the effecter, an effect can be imparted in the selected surround mode.

Further, the digital mixer performs, on a signal of each of the input channels, level control corresponding to a designated localizing position, and, when the localization-following mode is ON, the digital mixer controls the send level of the signal of the input channel in accordance with a designated surround mode and localizing position of the channel, to thereby output the thus-control signal to the second bus. In this manner, another set of mixing operations that can be used for effect input or the like can be carried out in such a manner to follow surround mixing operations for main output. In this case, the surround mode of the first bus and the surround mode of the second bus can be designated independently of each other. Thus, by the second bus set in the second surround mode outputting the controlled signal and the effecter outputting the effect-imparted signal to the first bus set in the first surround mode, the first bus can provide the effect-imparted signal of the first surround mode even where the effecter is not equipped with the first surround mode.

The present invention relates to the subject matter of Japanese Patent Application No. 2001-325969 filed on Oct. 24, 2001, the disclosure of which is expressly incorporated herein by reference in its entirety.

What is claimed is:

1. A digital mixer which selectively delivers signals from one or more channels to at least one of first buses and second buses so that mixing of the signals is performed via each of said first buses and second buses, and selectively outputs the signals mixed via each of said first buses and second buses, wherein, when said digital mixer generates multi-channel surround signals, said channels adjust levels of first signals to be delivered from said channels to said first buses in accordance with a selected first surround mode and a localizing position of each of said channels, said channels adjust levels of second signals to be delivered from said channels to said second buses in accordance with a selected second surround mode and said localizing position of each of said channels, said second buses mix the second signals delivered thereto and output the mixed second signals to an effecter for imparting a given effect to the mixed second signals in accordance with to said second surround mode, and said first buses receive the second signals imparted with the given effect from the effecter, mix the received second signals with the first signals delivered thereto and output the mixed signals as multi-channel surround signals corresponding to said first surround mode.

2. A digital mixer as claimed in claim 1 wherein said selected second surround mode is a surround mode that can be handled by the effecter.

3. A digital mixer as claimed in claim 2 wherein said selected first surround mode is a different surround mode from said selected second surround mode.

4. A digital mixer as claimed in claim 2 wherein said selected first surround mode is a same surround mode as said selected second surround mode.

5. A digital mixer as claimed in claim 1 wherein said selected first surround mode is at least one of a stereo mode, (2+2)-channel mode, (3+1)-channel mode, 5.1-channel mode, 6.1-channel mode and 7.1-channel mode.

6. A digital mixer as claimed in claim 1 wherein said selected second surround mode is at least a predetermined one of a stereo mode, (2+2)-channel mode, (3+1)-channel mode, 5.1-channel mode, 6.1-channel mode and 7.1-channel mode which can be handled by the effecter.

7. A digital mixer comprising:

a plurality of input channels for controlling signals input to said digital mixer;

a first bus section having a plurality of buses for performing mixing on signals given via one or more of said input channels;

a second bus section having a plurality of buses for performing mixing on signals given via one or more of said input channels;

a first designation device that designates a surround mode;

a second designation device that, every said input channel, designates a localizing position in two-dimensional coordinates;

a third designation device that, every said input channel, designates respective send levels of the signals with which the signals are to be delivered from the input channels to corresponding ones of the buses of said second bus section; and a fourth designation device that designates an ON/OFF state of a localization-following mode in said second bus section, wherein said plurality of input channels deliver respective input signals to corresponding ones of the buses of said first bus section after performing level control on the input signals in accordance with said surround mode designated by said first designation device and respective localizing positions of said input channels designated by said second designation device, wherein said plurality of input channels deliver respective input signals to the corresponding buses of said second bus section after performing level control on the input signals in accordance with the send levels designated by said third designation device, and wherein when the ON state of the localization-following mode is designated by said fourth designation device, said third designation device designates the send level of each of said input channels in accordance with the surround mode designated by said first designation device and the localizing position of the input channel designated by said second designation device, but when the OFF state of the localization-following mode is designated by said fourth designation device, said third designation device designates the send level of each of said input channels, irrespective of the surround mode designated by said first designation device and the localizing position of the input channel designated by said second designation device.

8. A digital mixer as claimed in claim 7 wherein the surround mode designated by said first designation device is at least one of a stereo mode, (2+2)-channel mode, (3+1)-channel mode, 5.1-channel mode, 6.1-channel mode and 7.1-channel mode.

9. A digital mixer as claimed in claim 7 which further comprises a fifth designation device that designates a surround mode of said second bus section independently of the surround mode designated for said first bus section.

10. A digital mixer as claimed in claim 7 wherein said second designation device designates the localizing position by means of an operator and in accordance with an operated amount of said operator.

11. A digital mixer comprising:

a plurality of input channels for controlling signals input to said digital mixer;

a first bus section having a plurality of buses for performing mixing on signals given via one or more of said input channels;

a second bus section having a plurality of buses for performing mixing on signals given via one or more of said input channels;

a first designation device that designates a first surround mode of said first bus section;

a second designation device that, every said input channel, designates a localizing position in two-dimensional coordinates;

a third designation device that, every said input channel, designates respective send levels of the signals with which the signals are to be delivered from the input channels to corresponding ones of the buses of said second bus section; and a fourth designation device that designates a second surround mode of said second bus section, wherein said plurality of input channels deliver respective input signals to corresponding ones of the buses of said first bus section after performing level control on the input signals in accordance with said first surround mode designated by said first designation device and respective localizing positions of said input channels designated by said second designation device, wherein said plurality of input channels deliver respective input signals to the corresponding buses of said second bus section after performing level control on the input signals in accordance with the send levels designated by said third designation device, and wherein said third designation device designates the send level of each of said input channels in accordance with said second surround mode designated by said fourth designation device and the localizing position of the input channel designated by said second designation device.

12. A digital mixer as claimed in claim 11 wherein said first surround mode designated by said first designation device is at least one of a stereo mode, (2+2)-channel mode, (3+1)-channel mode, 5.1-channel mode, 6.1-channel mode and 7.1-channel mode.

13. A digital mixer as claimed in claim 11 wherein said second surround mode designated by said fourth designation device is at least one of a stereo mode, (2+2)-channel mode, (3+1)-channel mode, 5.1-channel mode, 6.1-channel mode and 7.1-channel mode.

14. A digital mixer comprising:

a plurality of input channels, each of said input channels controlling characteristic of a signal provided to the input channel and selectively delivering the signal;

a plurality of first buses, each of said first buses mixing signals delivered from said input channels and outputting the mixed signal; and a plurality of second buses, each of said second buses mixing signals delivered from said input channels and outputting the mixed signal, in order to generated multi-channel surround signals, said digital mixer further comprising:

a mode setting device that sets a first surround mode for said first buses and a second surround mode for said second buses; and a position designating device that designates localizing position of sound of each of said input channels, wherein each of said input channels controls levels of said signal delivered from the input channel to each of said first buses according to said first surround mode and said localizing position of the input channel, and controls levels of said signal delivered from the input channel to each of said second buses according to said second surround mode and said localizing position of the input channel.

15. A digital mixer as claimed in claim 14, wherein the signals mixed on said first buses are output as output signals from the digital mixer, and the signals mixed on said second buses are input an effecter.

16. A digital mixer as claimed in claim 14, which further comprises a plurality of output channels corresponding to said first and second buses, each of said output channels controlling characteristic of the signal mixed on the corresponding one of said first or second buses.

17. A digital mixer comprising:

an input channel section including a plurality of input channels, said input channel section controlling a characteristic of a digital audio signal for each of the input channels;

a first bus section including a plurality of buses, each of the buses of said first bus section mixing first digital audio signals selectively inputted via said input channel section;

a second bus section including a plurality of buses, each of the buses of said second bus section mixing second digital audio signals selectively inputted via said input channel section;

a first surround designation section that designates a first surround mode of said digital mixer; and a second surround designation section that designates a second surround mode of said second bus section, wherein in response to designation, by said second surround designation section, of the second surround mode, said input channel section controls send levels of said second digital audio signals to be sent from said input channels to said second bus section, and wherein in response to designation, by said first surround designation section, of said first surround mode, said input channel section controls send levels of said first digital audio signals to be sent from said input channels to said first bus section, and said input channel section also controls send levels of said second digital audio signals, to be sent from said input channels to said second bus section, in such a manner as to follow control of the send levels of said first digital audio signals.

18. A digital mixer as claimed in claim 17 wherein said second surround mode to be designated by said second surround designation section is determined in accordance with input construction of an effecter connected to said digital mixer.

19. A digital mixer as claimed in claim 17 wherein said second digital audio signals, having been mixed via said second bus section, are given to an effecter connected to said digital mixer.

20. A digital mixing method which selectively delivers signals from one or more channels to at least one of first buses and second buses so that mixing of the signals is performed via each of said first buses and second buses, and selectively outputs the signals mixed via each of said first buses and second buses, wherein, in order to generate multi-channel surround signals, said method comprises:

adjusting levels of first signals to be delivered from said channels to said first buses in accordance with a selected first surround mode and a localizing position of each of said channels, adjusting levels of second signals to be delivered from said channels to said second buses in accordance with a selected second surround mode and said localizing position of each of said channels, causing said second buses to mix the second signals delivered thereto and output the mixed second signals to an effecter for imparting a given effect to the mixed second signals in accordance with to said second surround mode, and causing said first buses to receive the second signals imparted with the given effect from the effecter, mix the received second signals with the first signals delivered thereto and output the mixed signals as multi-channel surround signals corresponding to said first surround mode.

21. A storage medium comprising a computer program containing a group of instructions to cause a computer to perform the method as recited in claim 20.

22. A mixing method for a digital mixer which comprises a plurality of input channels for controlling signals input to said digital mixer, a first bus section having a plurality of buses for performing mixing on signals given via one or more of said input channels, and a second bus section having a plurality of buses for performing mixing on signals given via one or more of said input channels, said method comprising:

designating a surround mode;

every said input channel, designating a localizing position in two-dimensional coordinates;

every said input channel, designating respective send levels of the signals with which the signals are to be delivered from the input channels to corresponding ones of the buses of said second bus section; and designating an ON/OFF state of a localization-following mode in said second bus section, wherein said plurality of input channels deliver respective input signals to corresponding ones of the buses of said first bus section after performing level control on the input signals in accordance with the designated surround mode and the designated respective localizing positions of said input channels, wherein said plurality of input channels deliver respective input signals to the corresponding buses of said second bus section after performing level control on the input signals in accordance with the designated send levels, and wherein when the ON state of the localization-following mode is designated, said send level of each of said input channels is designated in accordance with the designated surround mode and the designated localizing position of the input channel, but when the OFF state of the localization-following mode is designated, said send level of each of said input channels is designated, irrespective of the designated surround mode and the designated localizing position of the input channel.

23. A storage medium comprising a computer program containing a group of instructions to cause a computer to perform the method as recited in claim 22.

24. A mixing method for a digital mixer which comprises a plurality of input channels for controlling signals input to said digital mixer, a first bus section having a plurality of buses for performing mixing on signals given via one or more of said input channels, a second bus section having a plurality of buses for performing mixing on signals given via one or more of said input channels, said method comprising:

designating a first surround mode of said first bus section;

every said input channel, designating a localizing position in two-dimensional coordinates;

every said input channel, designating respective send levels of the signals with which the signals are to be delivered from the input channels to corresponding ones of the buses of said second bus section; and designating a second surround mode of said second bus section, wherein said plurality of input channels deliver respective input signals to corresponding ones of the buses of said first bus section after performing level control on the input signals in accordance with the designated first surround and the designated respective localizing positions of said input channels, wherein said plurality of input channels deliver respective input signals to the corresponding buses of said second bus section after performing level control on the input signals in accordance with the designated send, and wherein said send level of each of said input channels is designated in accordance with the designated second surround mode and the designated localizing position of the input channel.

25. A storage medium comprising a computer program containing a group of instructions to cause a computer to perform the method as recited in claim 24.

26. A mixing method for a digital mixer which comprises a plurality of input channels, each of said input channels controlling characteristic of a signal provided to the input channel and selectively delivering the signal, a plurality of first buses, each of said first buses for mixing signals delivered from said input channels and outputting the mixed signal, and a plurality of second buses, each of said second buses mixing signals delivered from said input channels and outputting the mixed signal, in order to generated multi-channel surround signals, said method comprising:

setting a first surround mode for said first buses and a second surround mode for said second buses; and designating localizing position of sound of each of said input channels, wherein each of said input channels controls levels of said signal delivered from the input channel to each of said first buses according to said first surround mode and said localizing position of the input channel, and controls levels of said signal delivered from the input channel to each of said second buses according to said second surround mode and said localizing position of the input channel.

27. A storage medium comprising a computer program containing a group of instructions to cause a computer to perform the method as recited in claim 26.

28. A mixing method for a digital mixer which comprises a plurality of input channels controlling a characteristic of a digital audio signal for each of said input channels, a first bus section including a plurality of buses, each of the buses of said first bus section mixing first digital audio signals selectively inputted via said input channels, and a second bus section including a plurality of buses, each of the buses of said second bus section mixing second digital audio signals selectively inputted via said input channels, said method comprising:

designating a first surround mode of said digital mixer;

designating a second surround mode of said second bus section;

in response to designation of the second surround mode, controlling send levels of said second digital audio signals to be sent from said input channels to said second bus section; and in response to designation of said first surround mode, controlling send levels of said first digital audio signals to be sent from said input channels to said first bus section, and also controlling send levels of said second digital audio signals, to be sent from said input channels to said second bus section, in such a manner as to follow control of the send levels of said first digital audio signals.

29. A storage medium comprising a computer program containing a group of instructions to cause a computer to perform the method as recited in claim 28.

* * * * *